(12) United States Patent
Soma et al.

(10) Patent No.: US 6,291,979 B1
(45) Date of Patent: Sep. 18, 2001

(54) APPARATUS FOR AND METHOD OF DETECTING A DELAY FAULT

(75) Inventors: Mani Soma, Seattle, WA (US); Takahiro Yamaguchi; Masahiro Ishida, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/251,096

(22) Filed: Feb. 16, 1999

(51) Int. Cl.[7] .................................................. G01R 25/00
(52) U.S. Cl. ........................ 324/76.82; 375/371; 375/373; 702/72
(58) Field of Search ............................... 324/76.15, 76.82, 324/461, 76.55, 617, 76.53; 375/371, 373, 375, 376; 702/66, 69, 72, 79

(56) References Cited

U.S. PATENT DOCUMENTS

| | | | |
|---|---|---|---|
| 4,131,891 | * 12/1978 | Stavis | 343/112 |
| 4,704,574 | * 11/1987 | Nossen | 324/76.82 |
| 4,835,764 | * 5/1989 | Sulzbacher et al. | 370/29 |
| 5,028,886 | * 7/1991 | Seibel et al. | 331/4 |
| 5,333,154 | * 7/1994 | Hengeveld et al. | 375/106 |
| 5,361,277 | * 11/1994 | Grover | 375/107 |
| 5,578,917 | * 11/1996 | Bottman | 324/76.15 |

* cited by examiner

Primary Examiner—Safet Metjahic
Assistant Examiner—Vincent Q. Nguyen
(74) Attorney, Agent, or Firm—David N. Lathrop; Gallagher & Lathrop

(57) ABSTRACT

There is provided a method of and an apparatus for detecting delay faults in phase-locked loop circuits. A frequency impulse is applied to a phase-locked loop circuit under test as the reference clock, and a waveform of a signal outputted from the phase-locked loop circuit under test is transformed to an analytic signal to estimate an instantaneous phase of the analytic signal. A linear phase is estimated from the estimated instantaneous phase, and the estimated linear phase is removed from the estimated instantaneous phase to obtain a fluctuation term of the instantaneous phase. A delay time is measured from this fluctuation term of the instantaneous phase, and further, a delay fault is detected by comparing a time duration during which the phase-locked loop circuit remains in a state of oscillating a certain frequency with a time duration during which a fault-free phase-locked loop circuit remains in a state of oscillating that certain frequency.

5 Claims, 20 Drawing Sheets

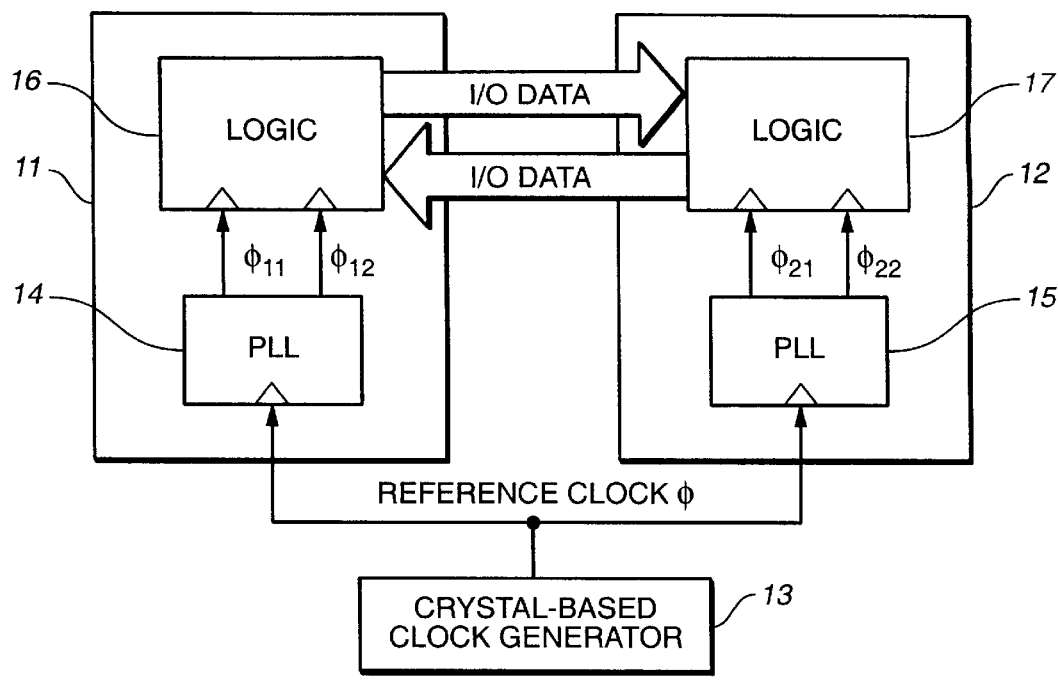
FIG._1
*(PRIOR ART)*
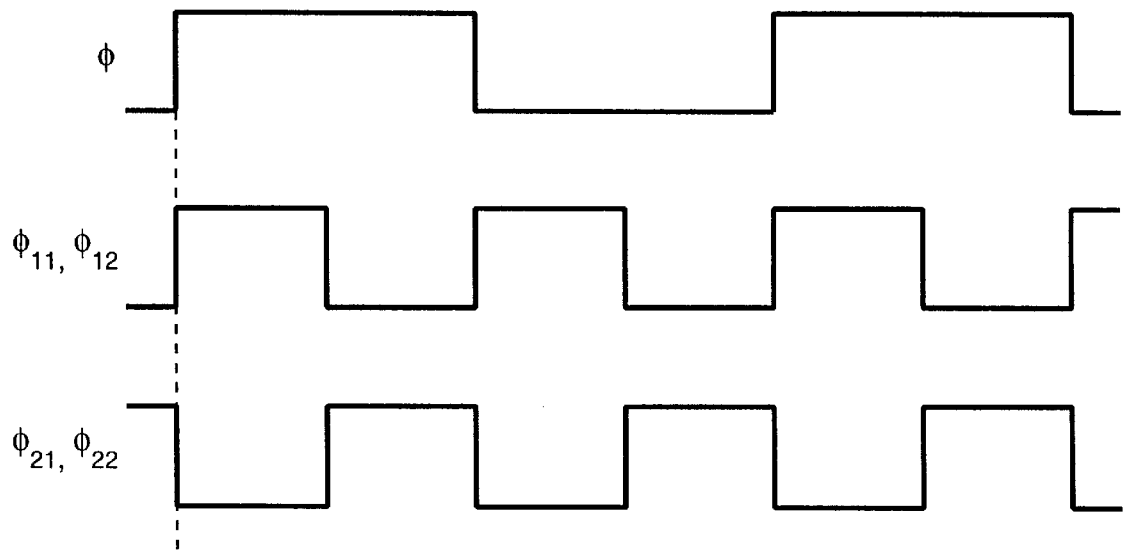
FIG._2
*(PRIOR ART)*

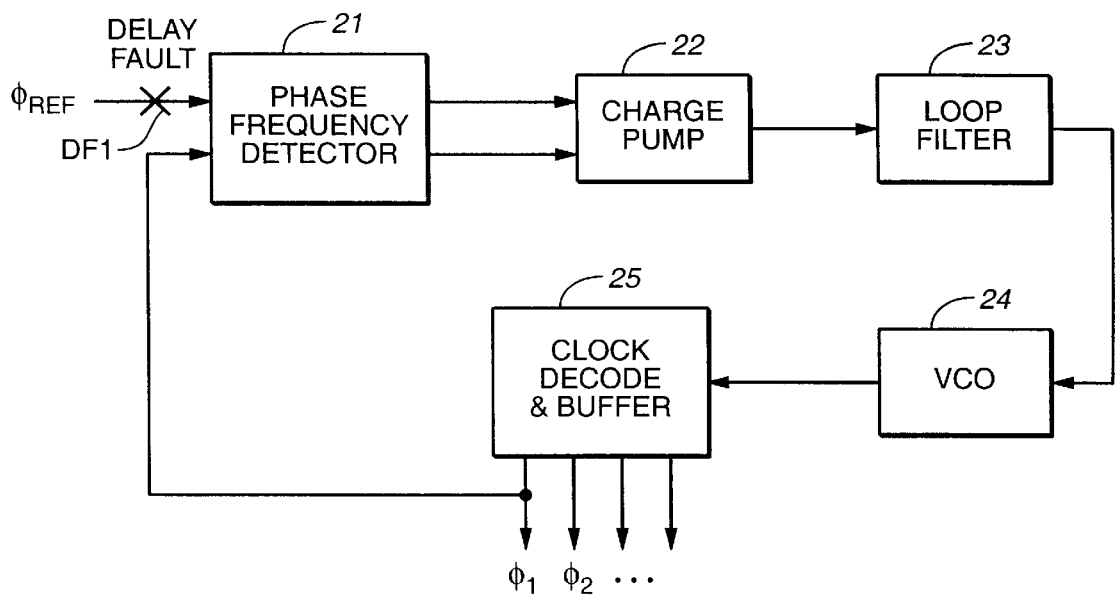
FIG._3
*(PRIOR ART)*
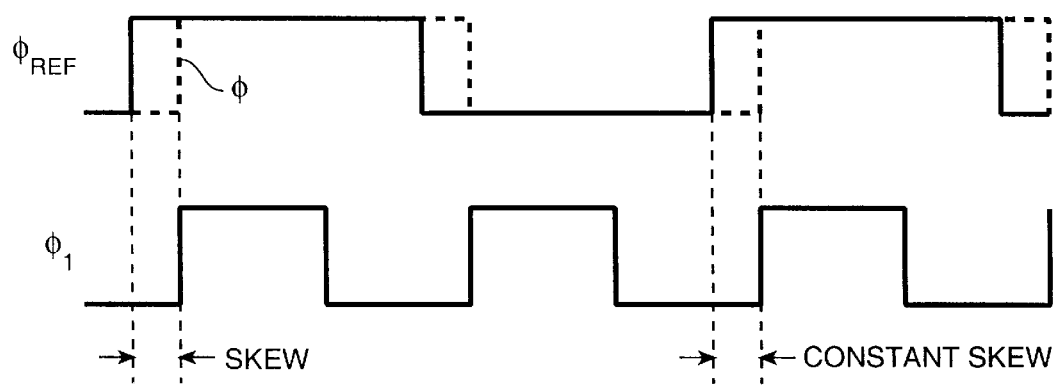
FIG._4
*(PRIOR ART)*

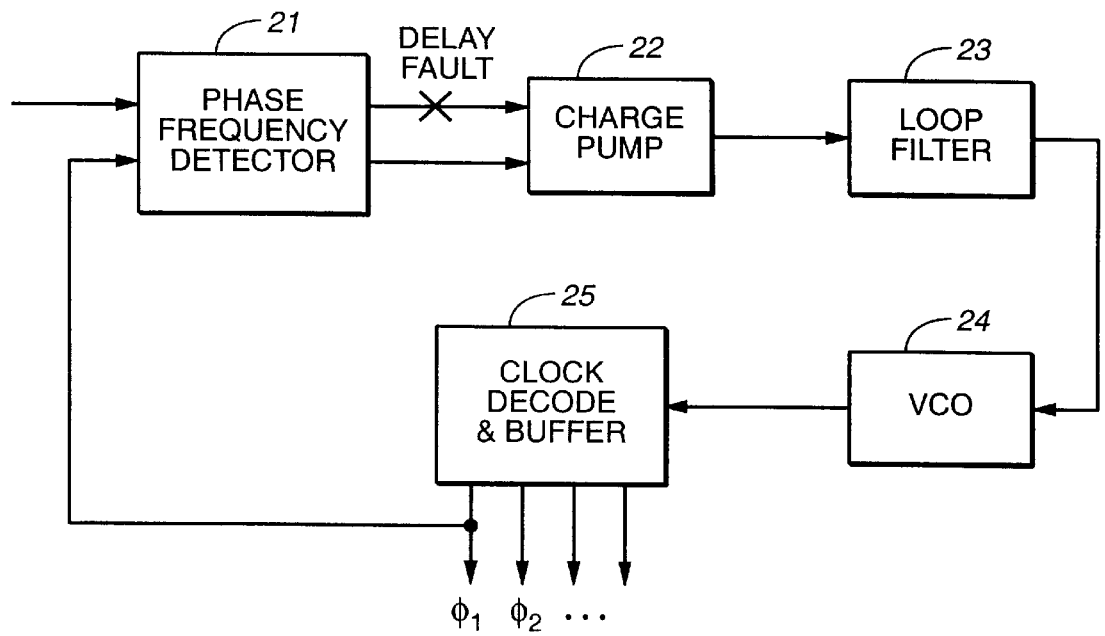
FIG._5
(PRIOR ART)
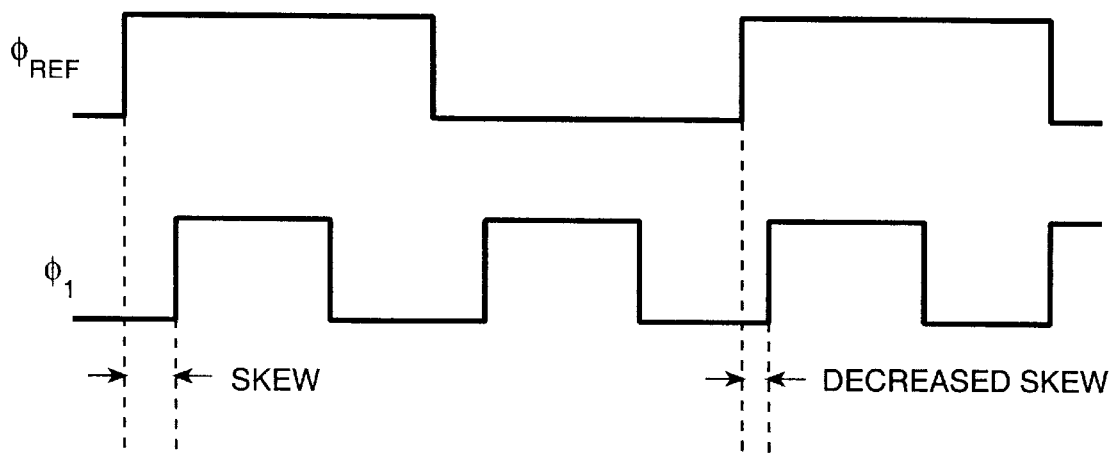
FIG._6
(PRIOR ART)

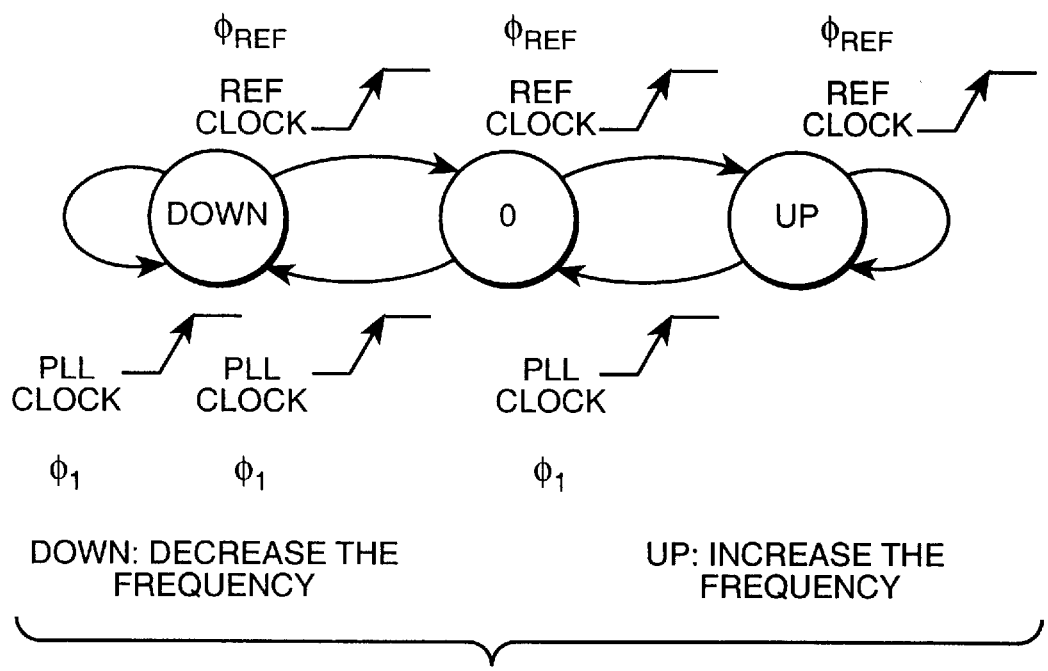
FIG._7
*(PRIOR ART)*
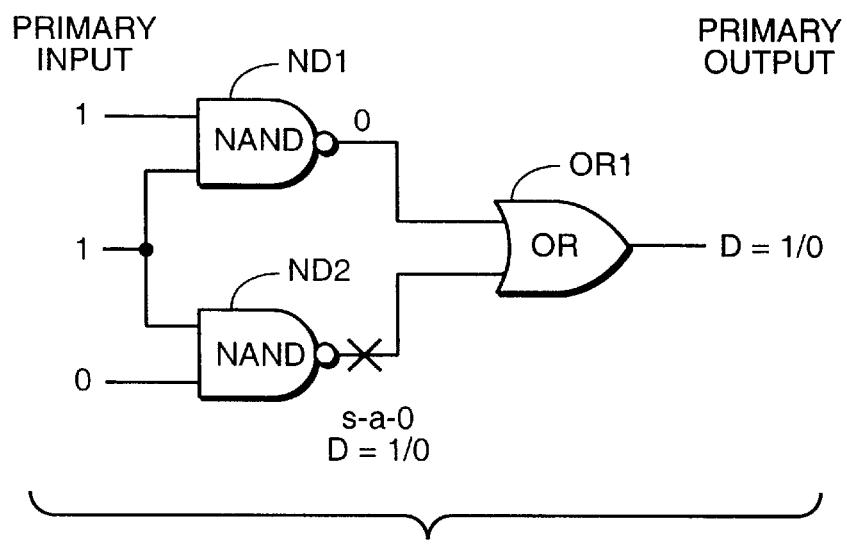
FIG._8
*(PRIOR ART)*

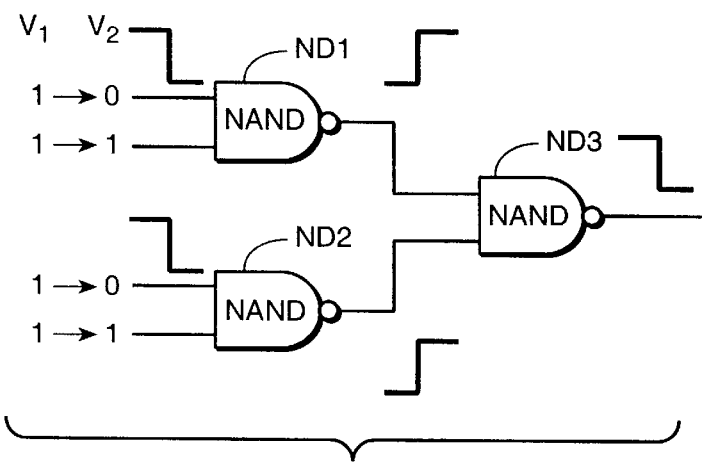
FIG._9
(PRIOR ART)
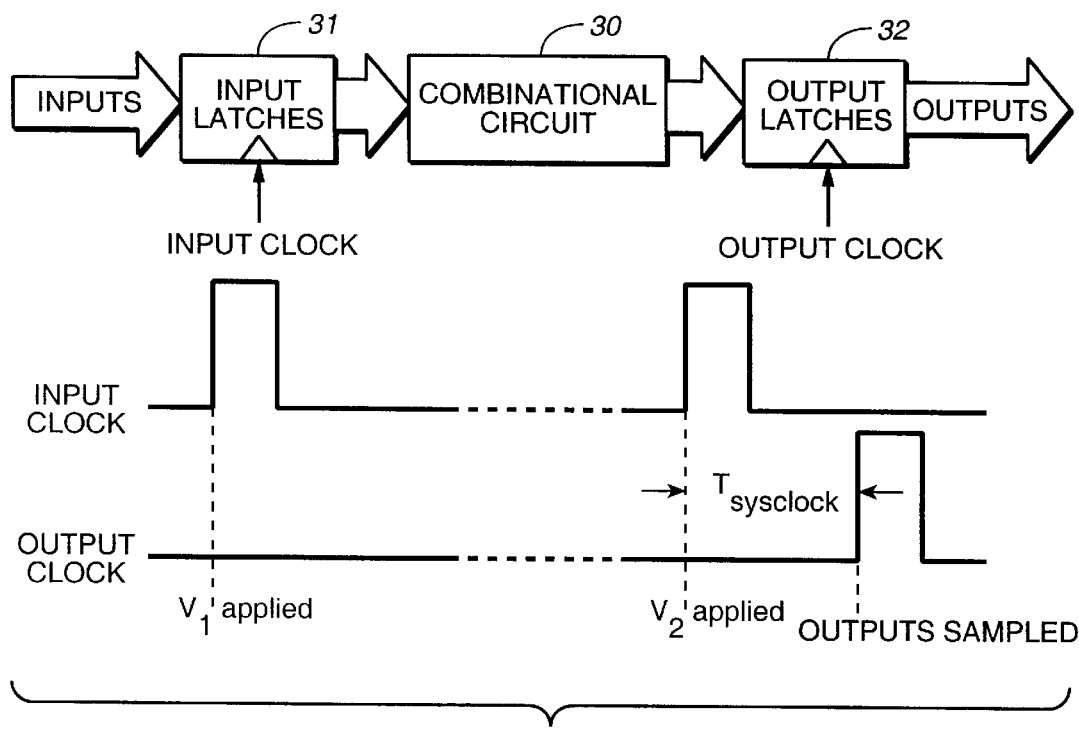
FIG._10
(PRIOR ART)

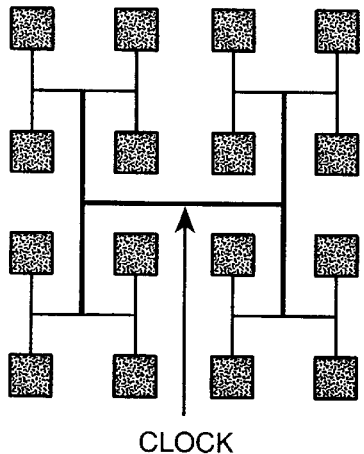
CLOCK
FIG._11
(PRIOR ART)
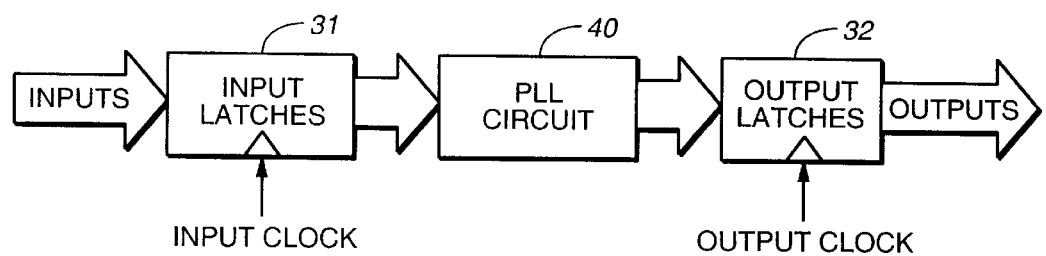
FIG._12
(PRIOR ART)

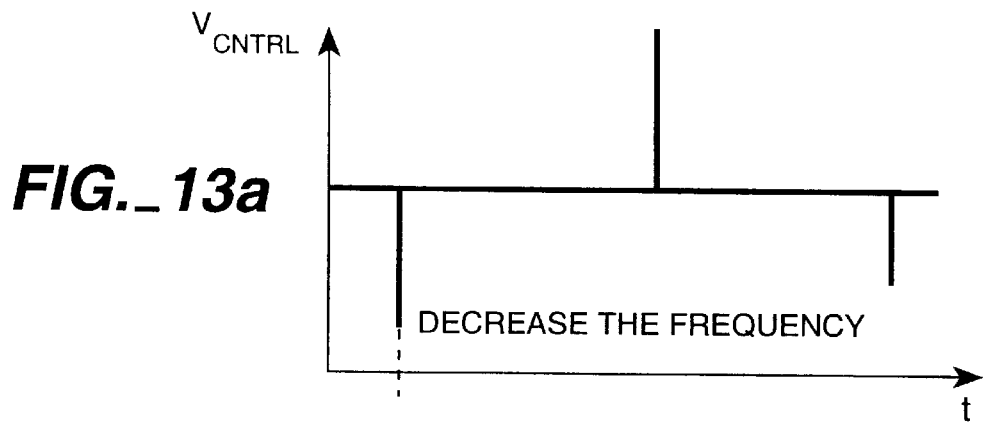
FIG._13a
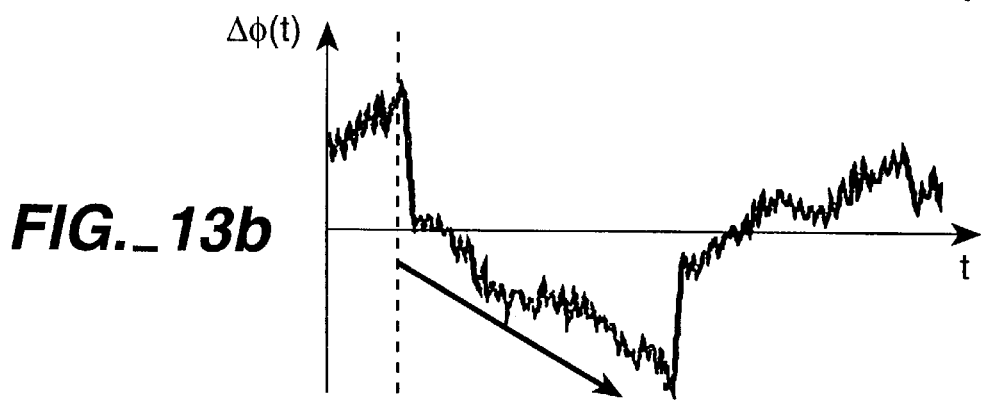
FIG._13b
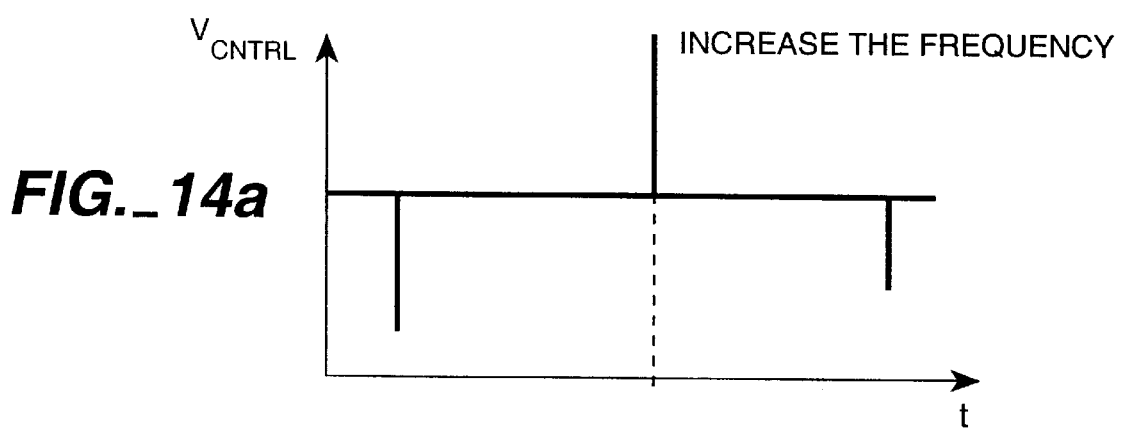
FIG._14a
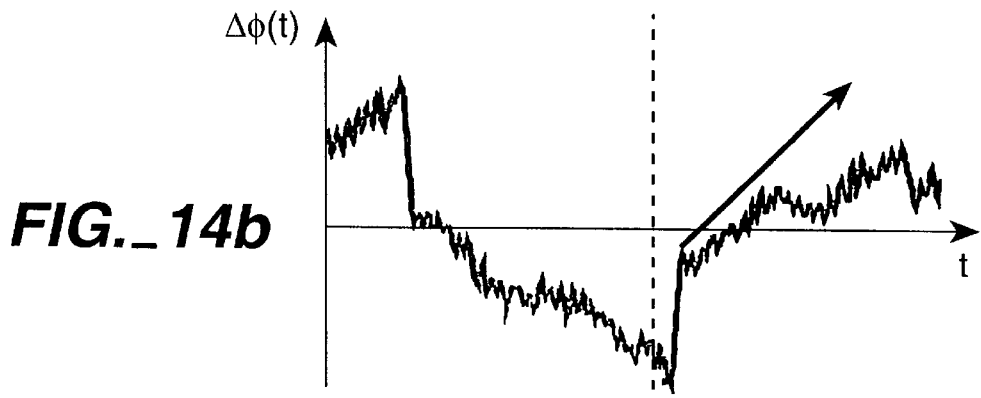
FIG._14b

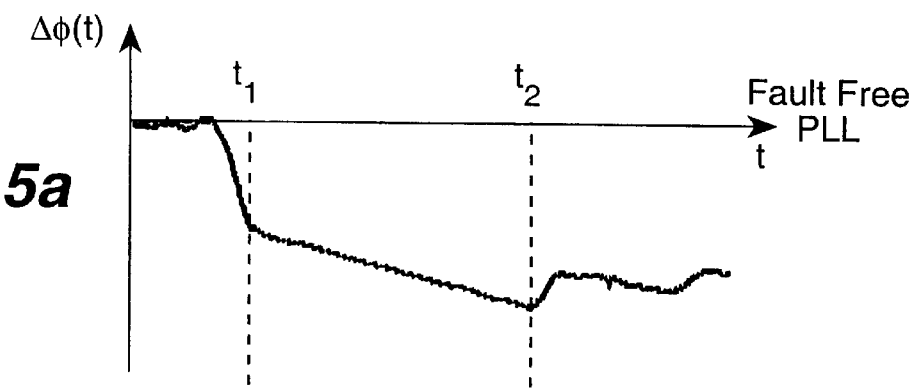
FIG._15a
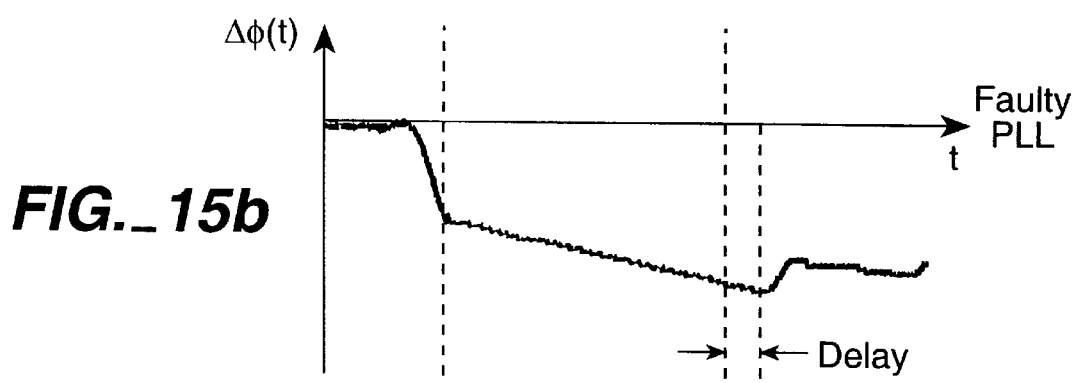
FIG._15b
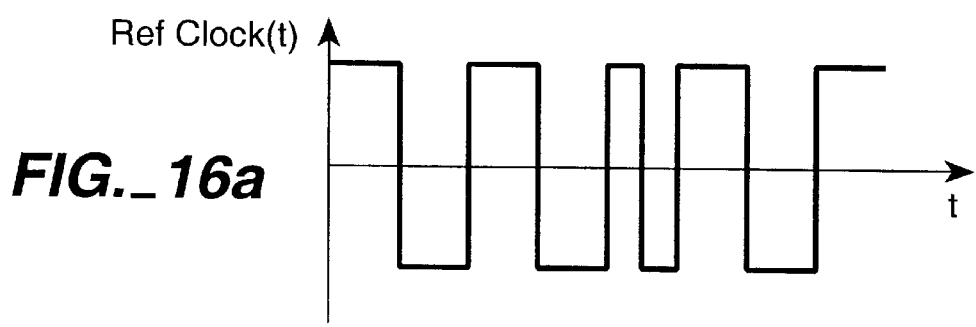
FIG._16a
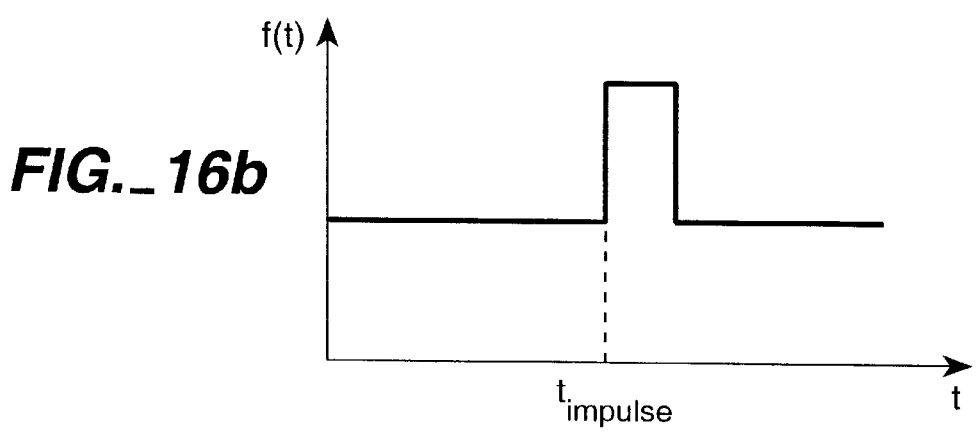
FIG._16b

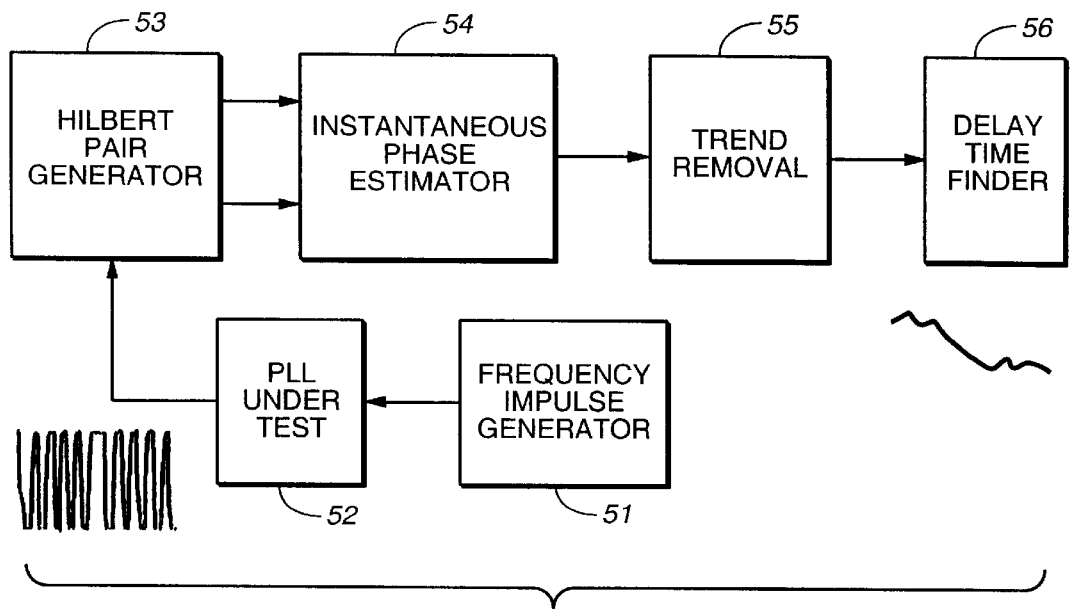
FIG._17
| PARAMETERS | nMOS | pMOS | UNIT |
|---|---|---|---|
| $V_{TO}$ | 0.7386893 | -0.9160475 | V |
| $t_{OX}$ | 135.23 | 134.216 | A |
| XL | -0.0672454 | -0.0287155 | μm |
| XW | -0.166238 | -0.200027 | um |
| RSH | 64.7204 | 117.086 | Ω/[] |
FIG._18

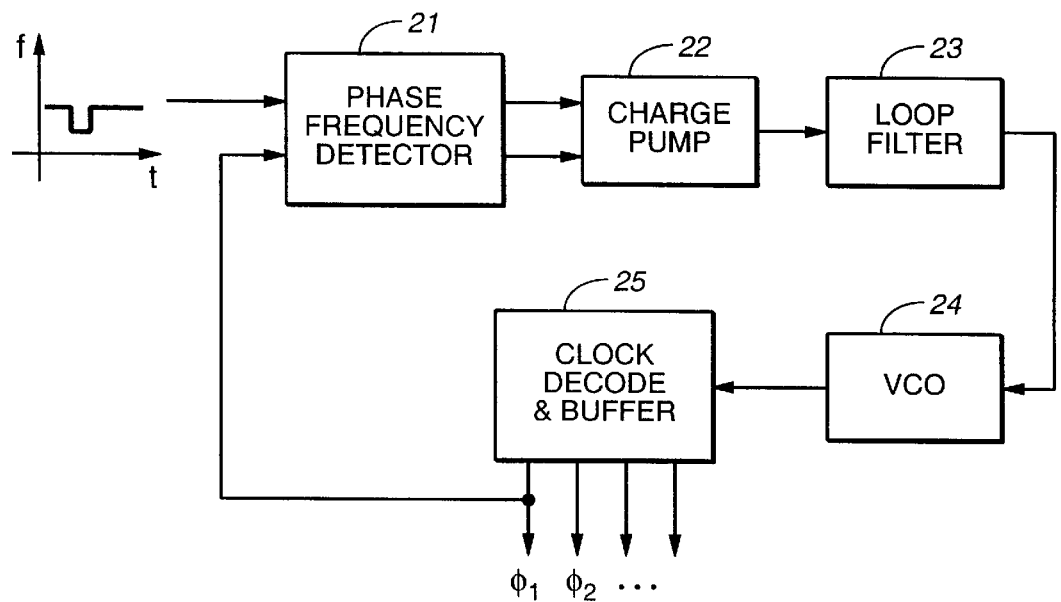
FIG._19
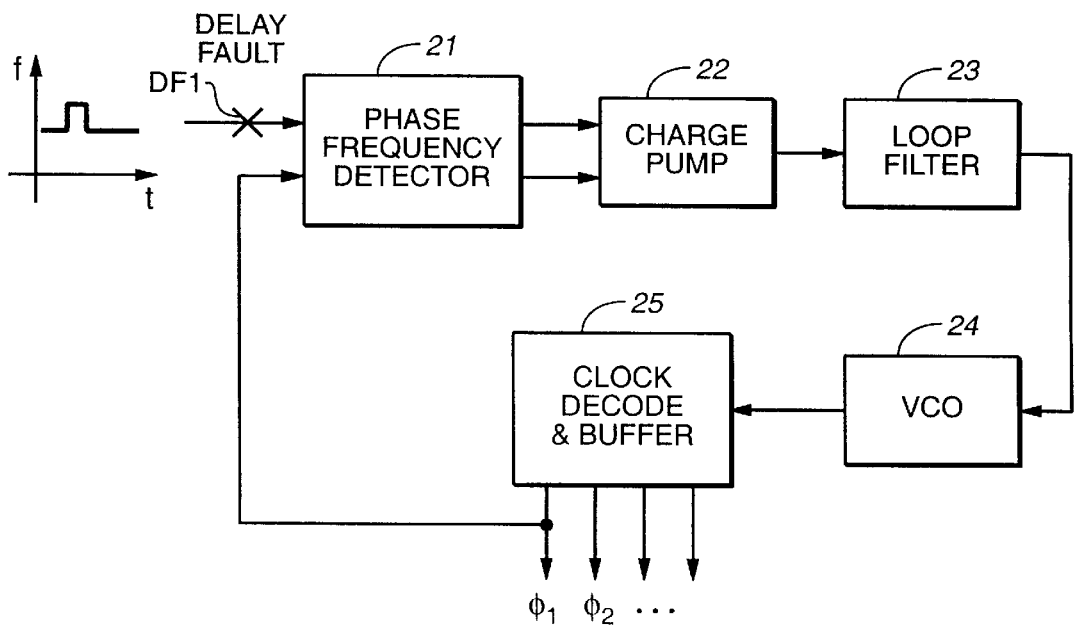
FIG._22

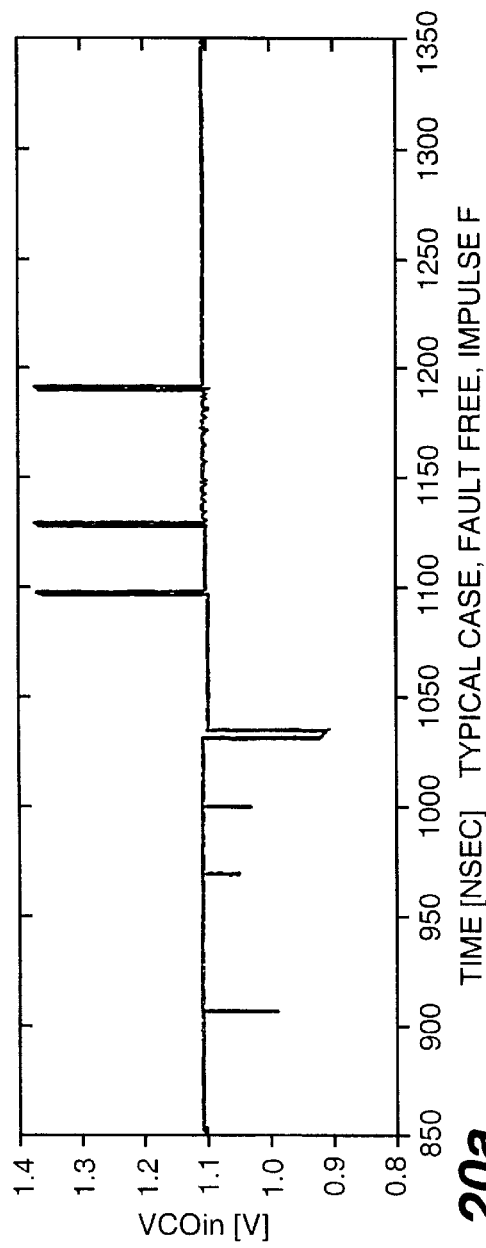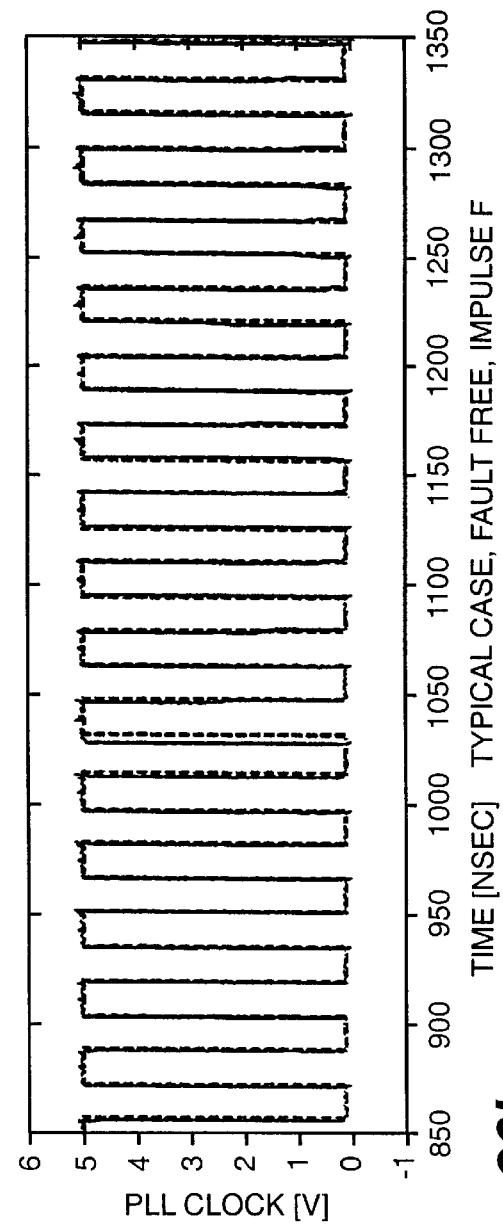
FIG._20a
FIG._20b

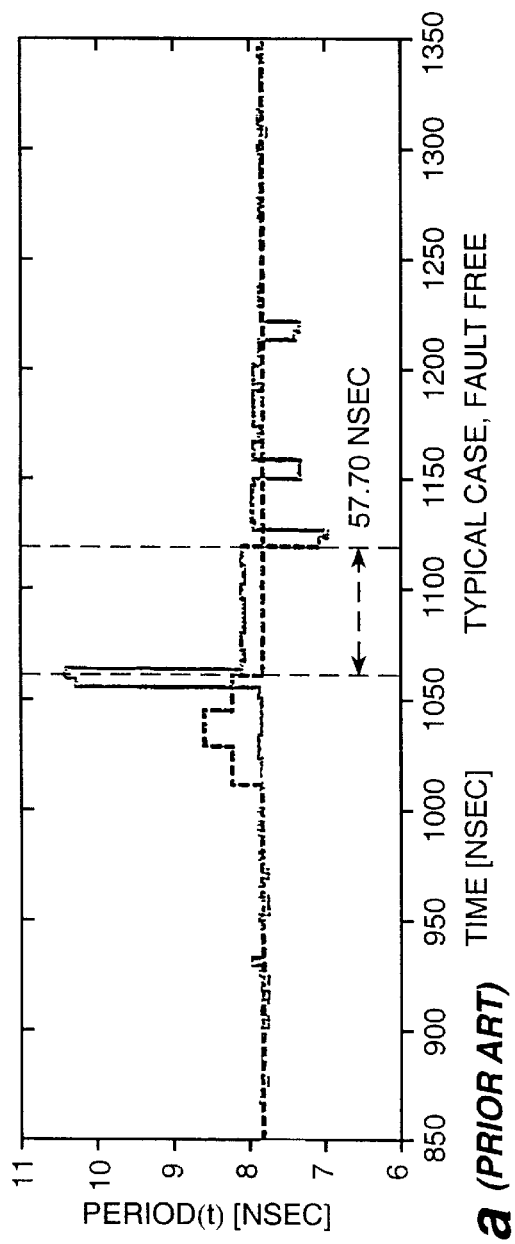
FIG._21a (PRIOR ART)
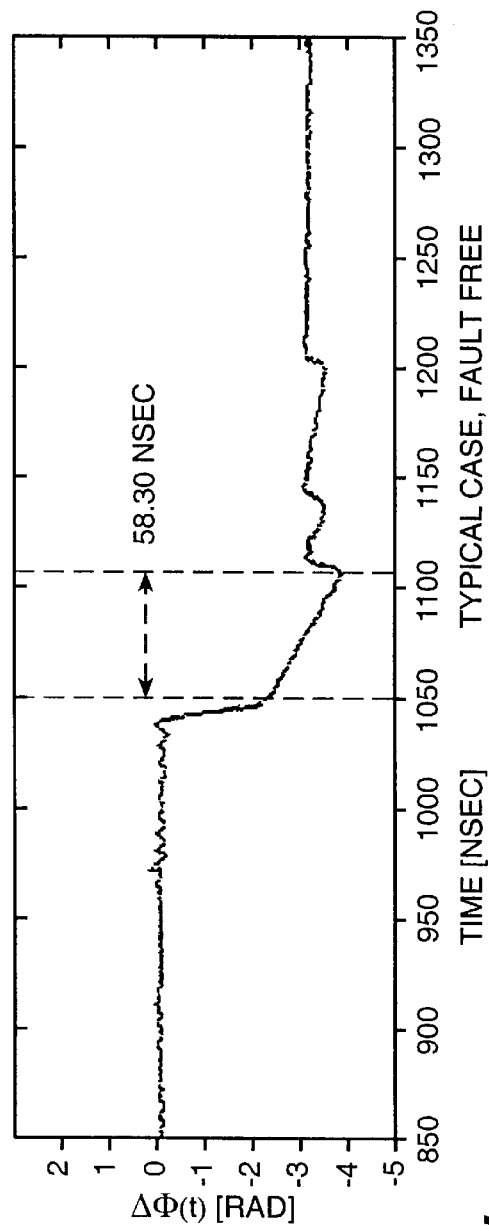
FIG._21b

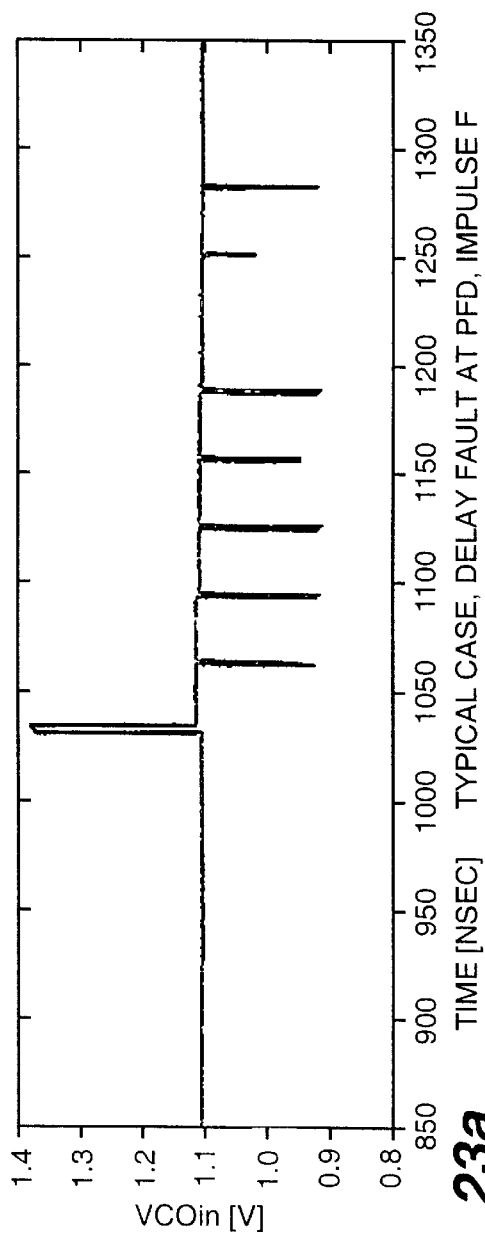
FIG._23a
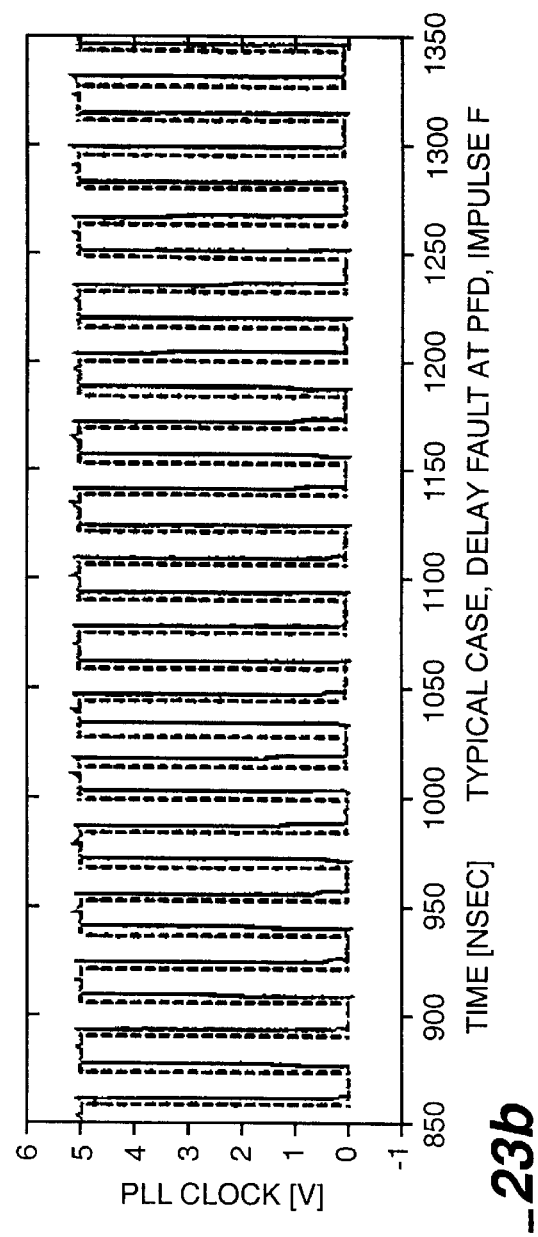
FIG._23b

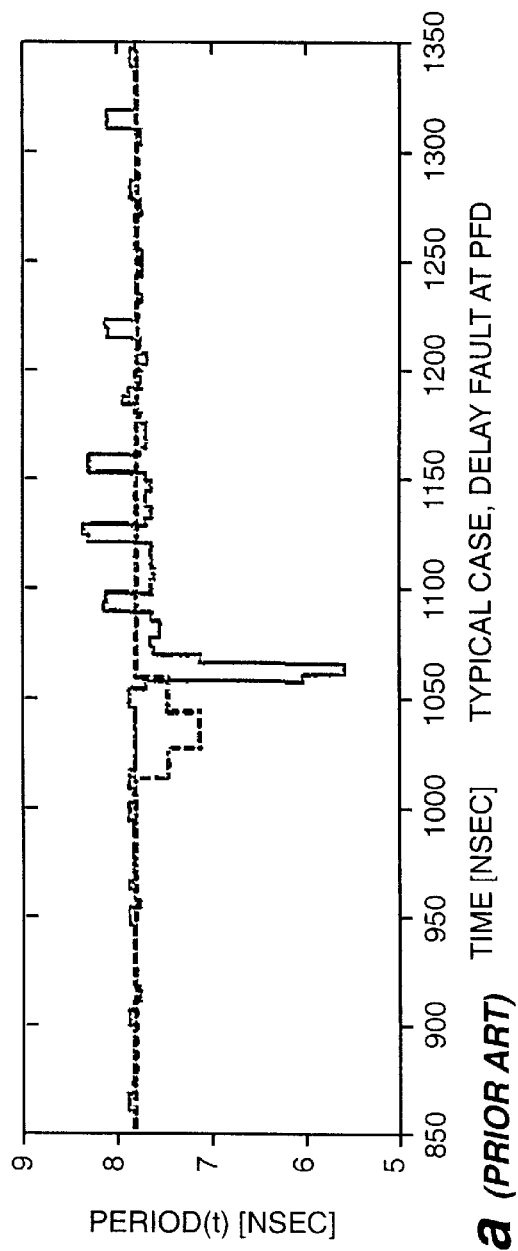
FIG._24a *(PRIOR ART)*
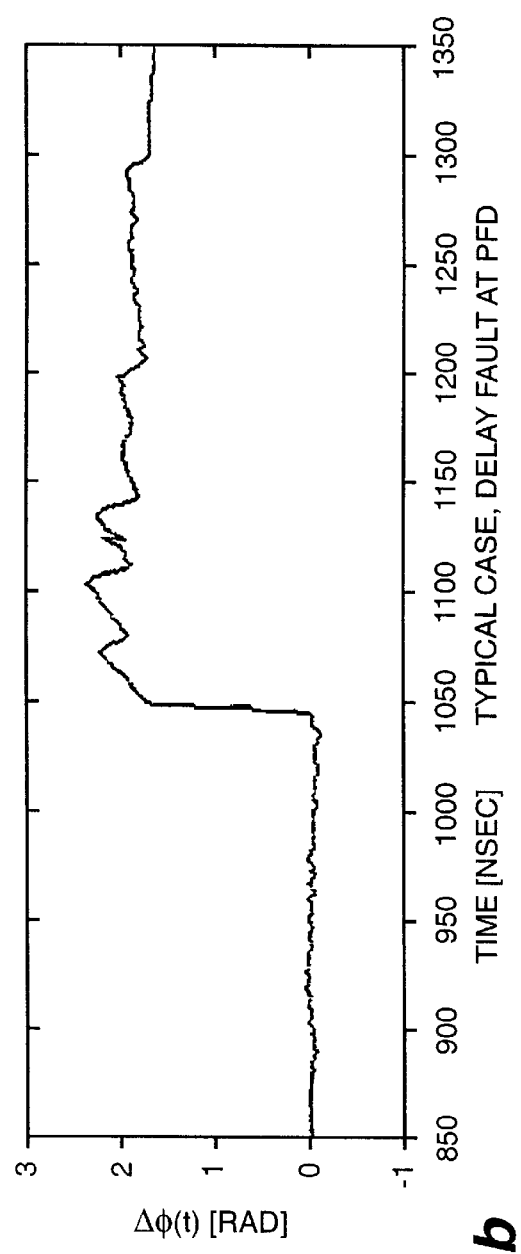
FIG._24b

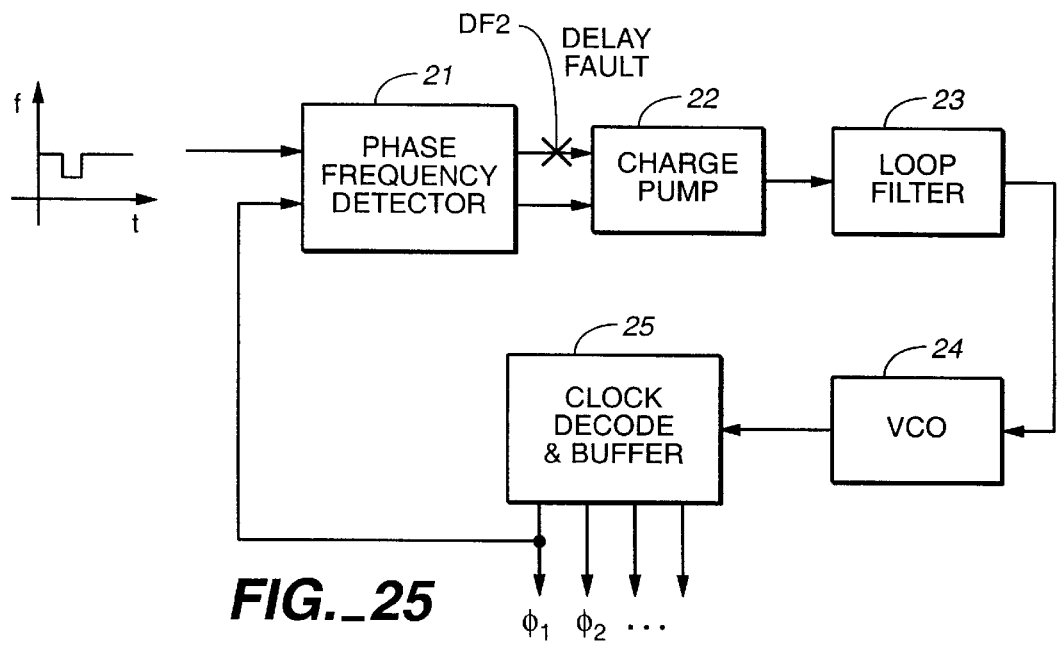
FIG._25
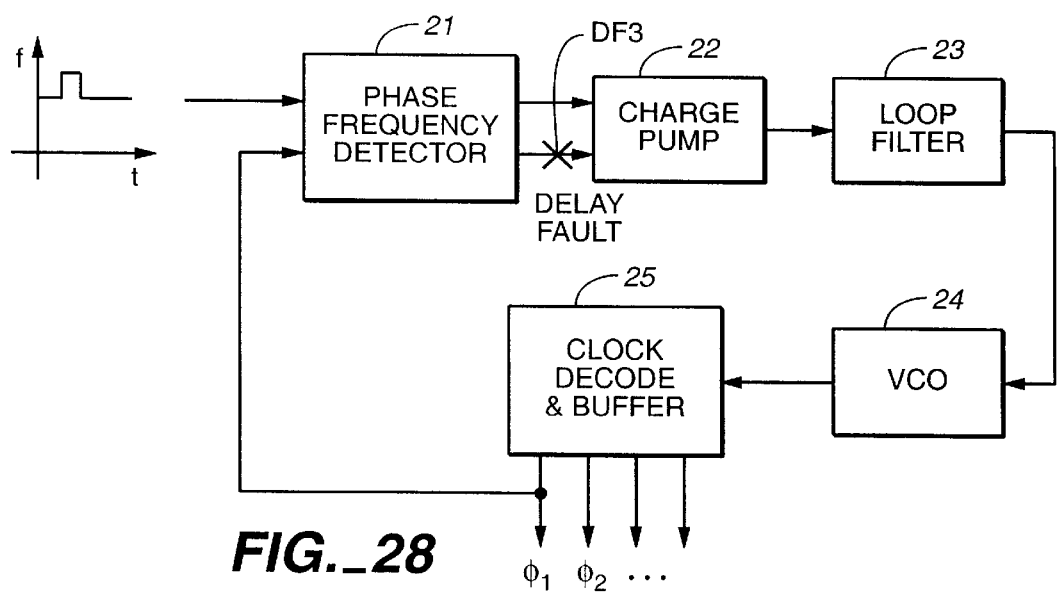
FIG._28

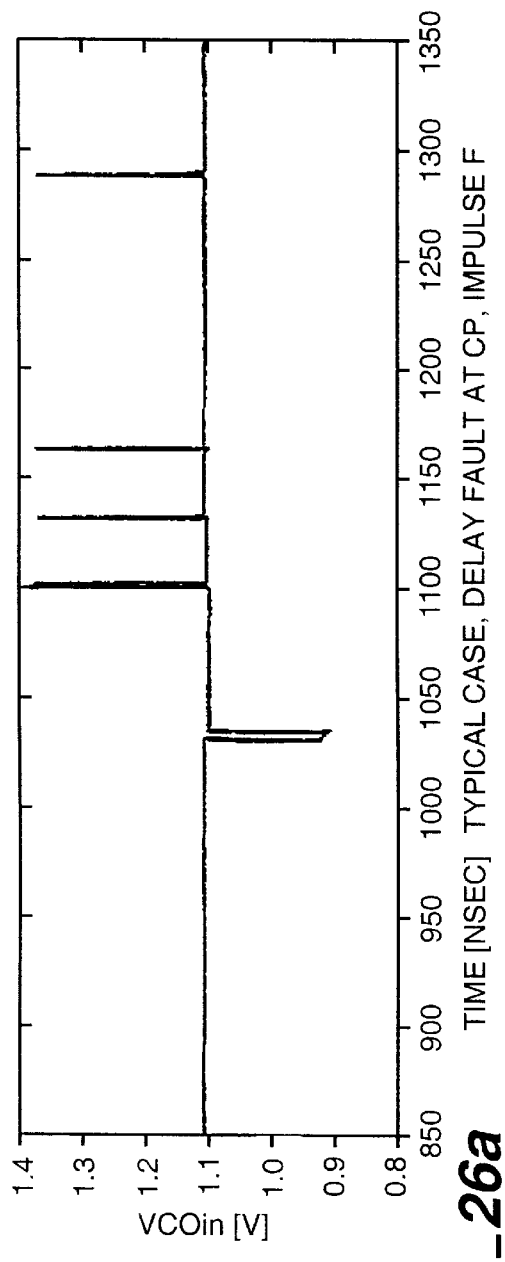
FIG._26a
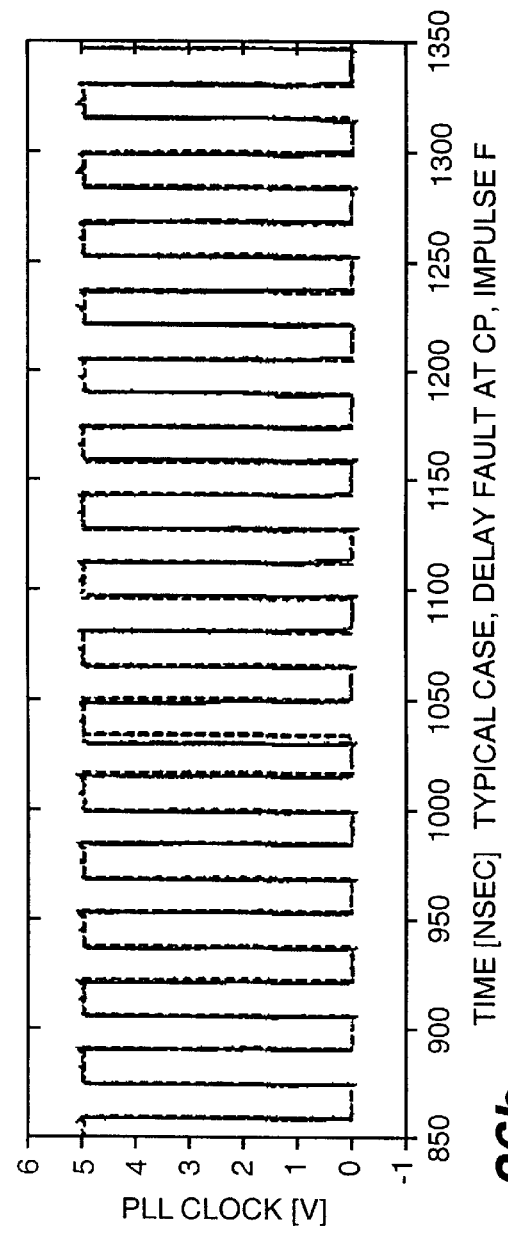
FIG._26b

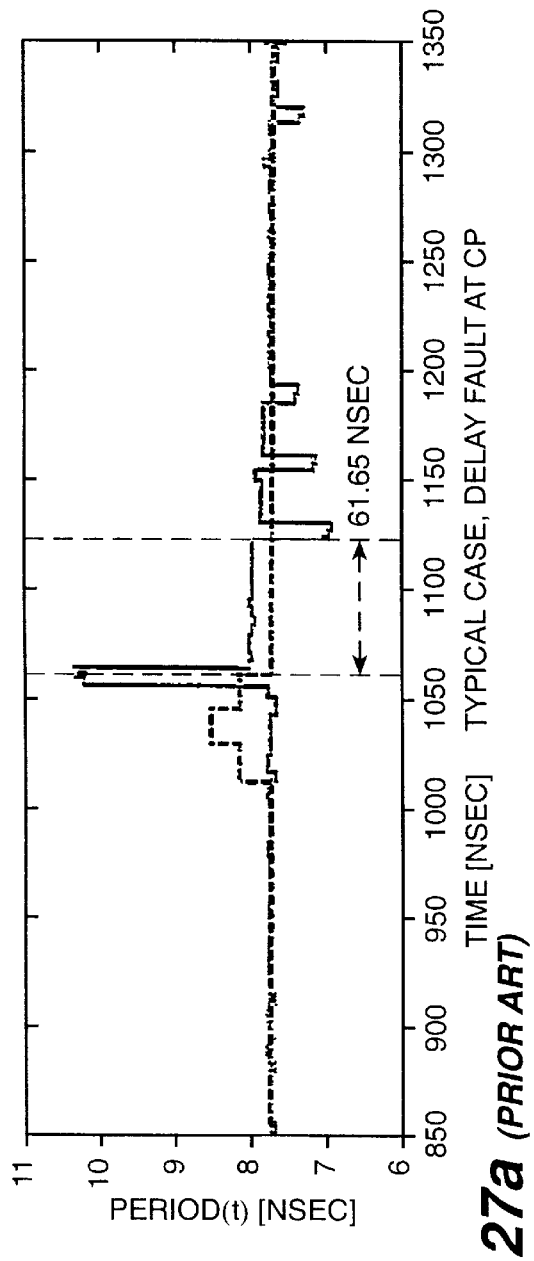
FIG._27a (PRIOR ART)
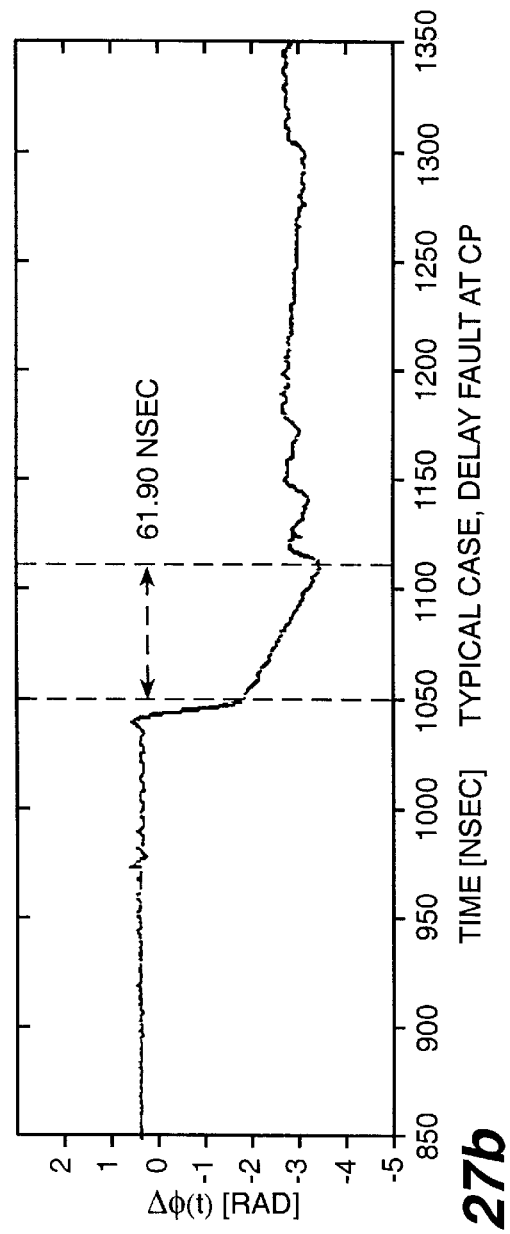
FIG._27b

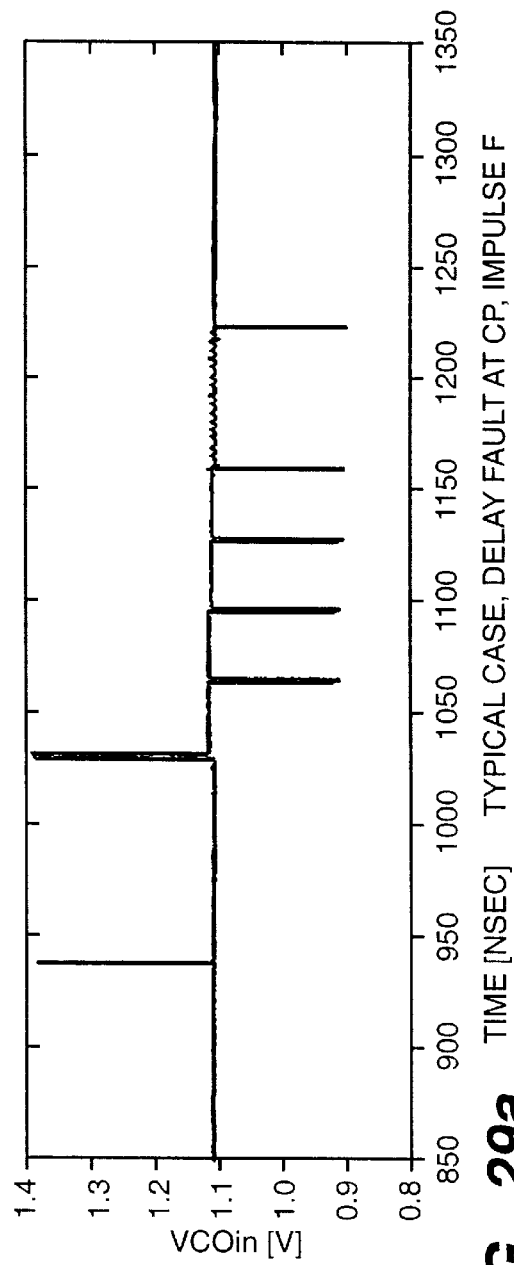
FIG._29a
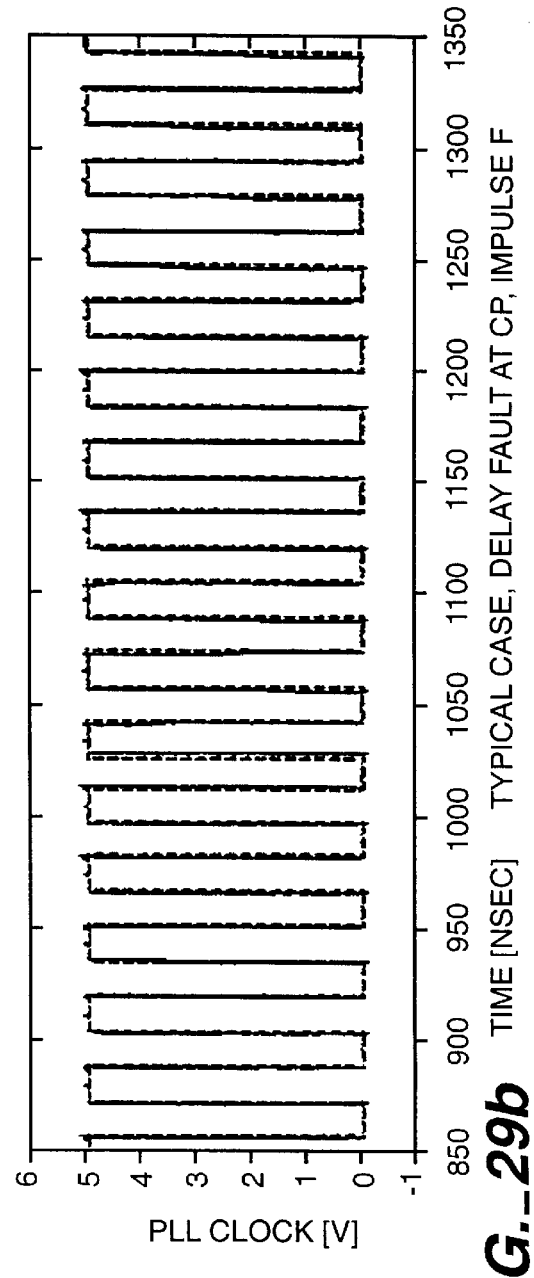
FIG._29b

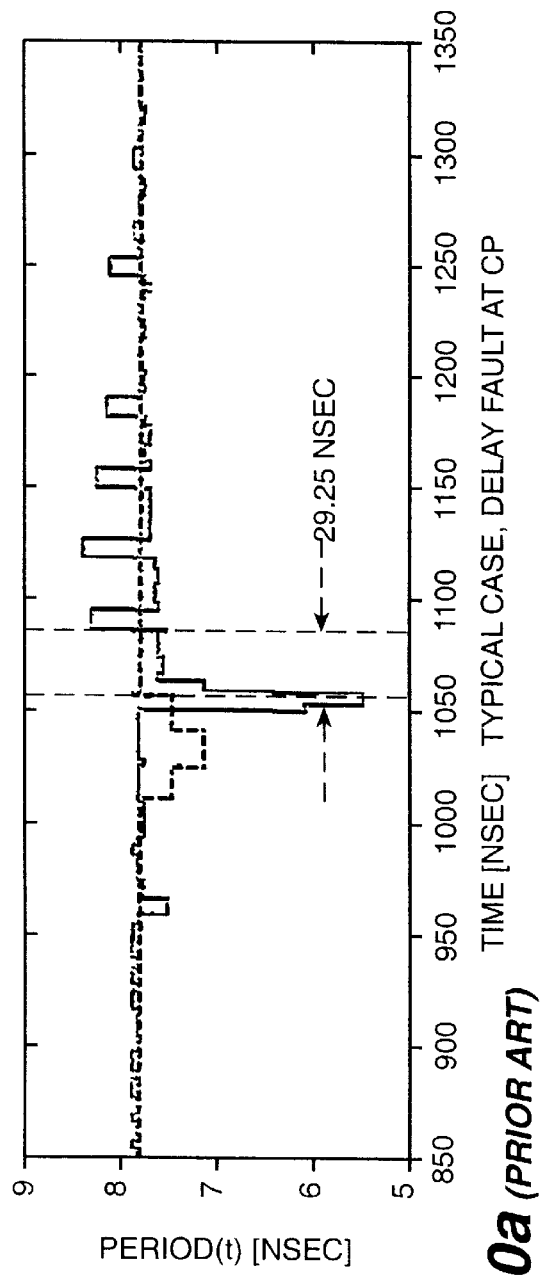
FIG._30a (PRIOR ART)
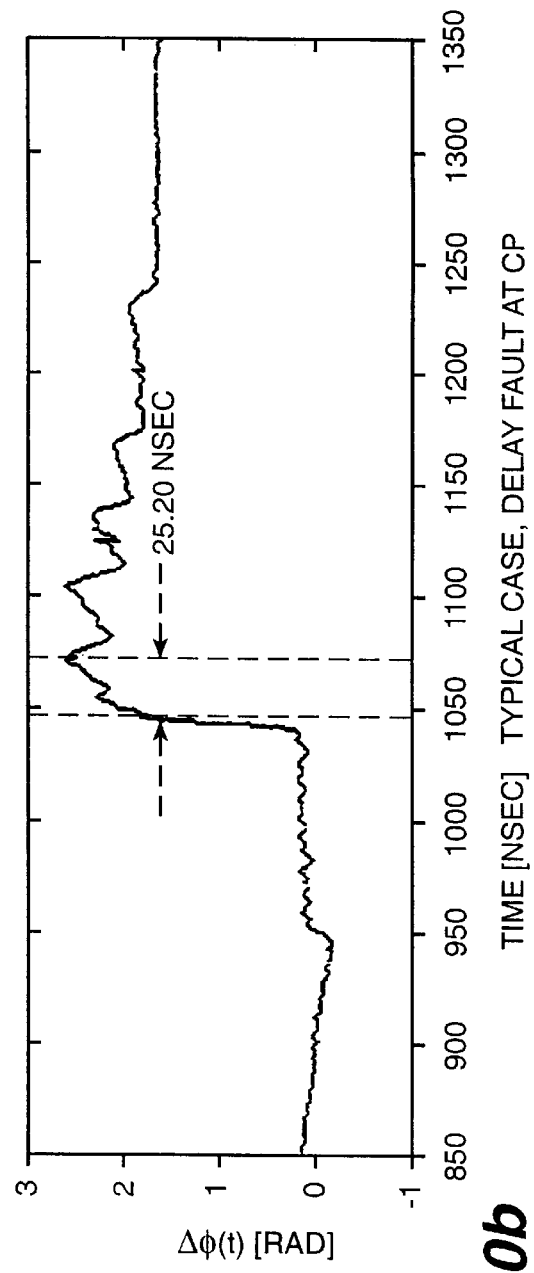
FIG._30b

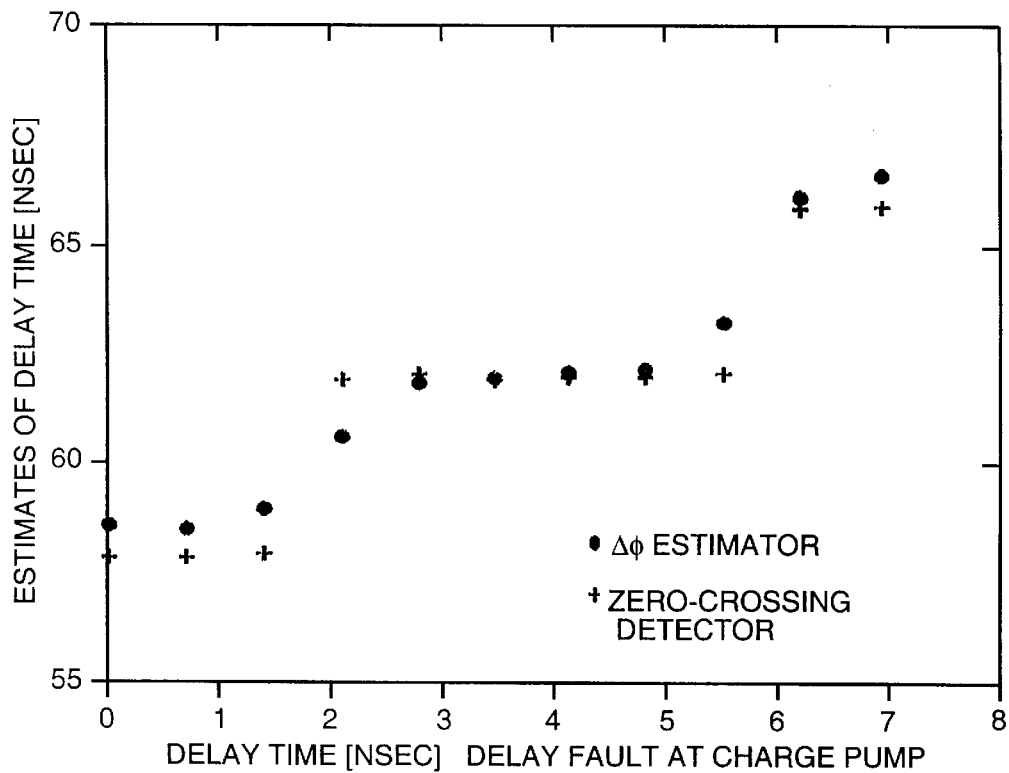
FIG._31
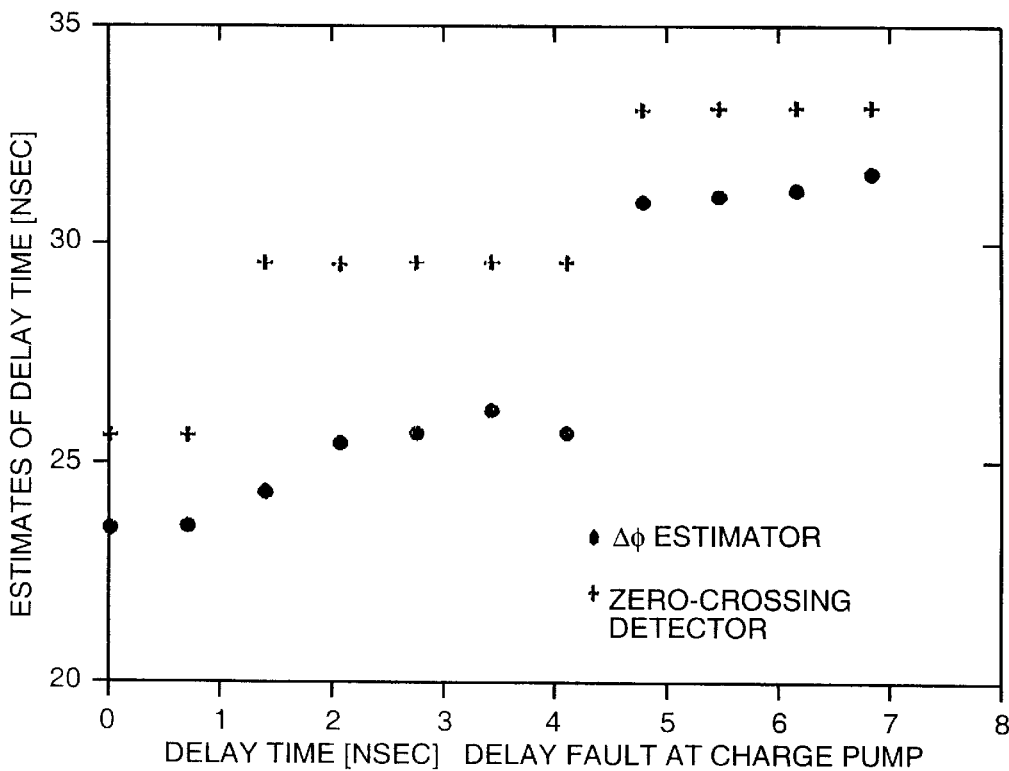
FIG._32

APPARATUS FOR AND METHOD OF DETECTING A DELAY FAULT

BACKGROUND OF THE INVENTION

1. Field of the Invention

The present invention relates to an apparatus for and a method of detecting a delay fault in a phase-locked loop circuit, and more particularly, relates to a delay fault detecting apparatus and a delay fault detecting method which are suitable for detecting delay faults in phase-locked loop (hereinafter referred to as PLL) circuits formed on VLSI (very large scale integrated circuit) chips respectively.

2. Description of the Related Art

A synchronous system performs a cooperative operation by sharing a timing of a clock edge with one another. The more the timing of the shared edge is controlled at high accuracy, the more the synchronous system can operate at a high rate. FIG. 1 shows an example of the synchronous system. This system has such a configuration that a plurality of (in this example, two) VLSI chips 11 and 12 are placed on a single board (not shown). A reference clock $\phi$ is supplied to each of the VLSI chips 11 and 12 from a high precision oscillator (for example, a crystal-based clock generator) 13 provided on the board. PLL circuits 14 and 15 on those VLSI chips output, as shown in FIG. 2, clocks $\phi_{11}$, $\phi_{12}$, and $\phi_{21}$, $\phi_{22}$ generated by the on-chip clock generators with their edges synchronized with the edge of the reference clock $\phi$ supplied from the outside, and those clocks are distributed to subsystems 16 and 17, respectively. (For example, refer to a reference literature d1.)

As stated above, by synchronizing the edge of an internal clock with respect to the edge of a reference clock, data can be transmitted and received between different chips. The PLL circuits 14 and 15 play a role in minimizing a clock skew and ensuring a high speed operation of the system, by aligning the frequency and the phase of an oscillation waveform of a voltage-controlled oscillator (hereinafter referred to as VCO) with respect to the frequency and the phase of the inputted reference clock $\phi$.

As is well known, in a microcomputer, an instantaneous value (a peak-to-peak jitter or the like) of the worst case may determine the operational frequency of the microcomputer. Therefore, it is necessary in the microcomputer to positively detect, by a test, any fault that increases a clock skew even for an instant.

Next, an influence of a delay fault in a PLL circuit on a system will be discussed. FIG. 3 shows an example of the PLL circuit. This PLL circuit comprises a phase-frequency detector 21, a charge pump circuit 22, a loop filter 23, a VCO 24, and a clock decode and buffer circuit 25. Now, it is assumed that a delay fault DF1 is present at the reference clock input side of the phase-frequency detector 21. As shown in FIG. 4, a reference clock $\phi_{REF}$ (indicated by a solid line) applied to the phase-frequency detector 21 of the PLL circuit becomes a clock $\phi$ (indicated by a dotted line) which has been delayed by a constant time interval due to the delay fault DF1 present at the input side, and the delayed clock $\phi$ is fed into the charge pump circuit 22 at the next stage. In the PLL circuit, an edge of an internal clock $\phi_1$ (indicated by a solid line) outputted from the clock decode and buffer circuit 25 is synchronized with respect to the edge of the dotted line clock $\phi$ which has been delayed by the constant time interval. As a result, a clock skew occurs in response to the delay fault DF1. Moreover, the clock skew, which is a deviation generated at the reference clock input side, is not compensated in the PLL circuit and remains as a constant value. As a result, it appears that a large steady-state deviation remains.

Since this delay fault DF1 is not a fault of an internal block (internal component) of the PLL circuit, the PLL circuit gets into a synchronous state. Accordingly, it is difficult to detect a delay fault at the reference clock input side even if internal blocks of the PLL circuit are tested. However, a delay fault of this type can easily be detected by comparing the external reference clock $\phi_{REF}$ with the internal clock $\phi_1$.

Next, as shown in FIG. 5, it is assumed that a delay fault DF2 is present at the Up signal input side of the charge pump circuit 22. Due to the delay fault DF2, a timing in the charge pump circuit 22 for converting an Up signal inputted thereto from the phase-frequency detector 21 to an analog signal to output the analog signal is delayed. Further, the delay of the analog signal causes a timing of an oscillation waveform of the VCO 24 to delay.

In the next step, the phase-frequency detector 21 compares the edge of the reference clock $\phi_{REF}$ with the edge of the internal clock $\phi_1$, and controls the timing of the oscillation waveform of the VCO 24 by using, as a phase error signal, a time interval between the rising edges of the two clocks. The control for the feedback loop is carried out until the rising edges of both the clocks are aligned with each other. Therefore, the delay fault DF2 appears simultaneously with a state transition and is compensated by the feedback. The delay time has its maximum value when the state transition occurs. Consequently, as shown in FIG. 6, a clock skew has also its maximum value when the state transition occurs, and it is decreased to zero with the lapse of time. In this manner, since a PLL circuit is a feedback system, a transient skew occurs. A timing at which a transient skew occurs is limited, and hence it is difficult to detect the transient skew by a test.

As mentioned above, in the case that a delay fault DF1 is present at the reference clock input end of the phase-frequency detector 21, a clock skew having a constant time interval occurs. This clock skew is not compensated in the PLL circuit. On the other hand, in the case that a delay fault DF2 is present at the Up signal input end of the charge pump circuit 22, a large clock skew transiently appears in correspondence to a state transition shown in FIG. 7. This transient clock skew DF2 is compensated in the PLL circuit and approaches toward zero. All the delay faults of other blocks (an input end of the loop filter 23 and an input end of the VCO 24) of the PLL circuit can be mapped to the delay fault in the input end of the charge pump circuit 22.

A stuck-at fault testing (for example, refer to a reference literature d2) has conventionally been utilized most widely in the verification test and the manufacturing test of VLSI chips. First, the stuck-at fault testing will briefly be explained.

A fault model is a model in which a physical defect is abstracted. When the fault model is used, a fault can easily be simulated using a computer. For example, a state in which an output of a CMOS (complementary metal-oxide semiconductor) inverter keeps taking a logical value "1" can be explained by using a model in which a stuck-at 1 fault is present at the output of the inverter. As a cause of this type of fault, there can be considered a defect that a short circuit has been formed between the output of the inverter and a power supply voltage $V_{DD}$ or a physical defect that a drain of an nMOS (n-channel metal-oxide semiconductor) has been opened.

In the testing, a test pattern is applied to primary inputs of a circuit under test and a response pattern of the circuit appearing at primary outputs of the circuit under test is observed. A check is made, by comparing this response pattern with an expected value pattern in fault-free operation, to see whether the circuit is faulty or not. FIG. 8 shows a combinational circuit of a NAND gate ND1 having a stuck-at 0 fault and a NAND gate ND2 having no stuck-at fault. The outputs of both the NAND gates ND1 and ND2 are taken out through an OR gate OR1 as a primary output.

A test pattern which can detect the stuck-at 0 fault in this combinational circuit is "110". That is, it means that as shown in FIG. 8, the test pattern "110" is applied to the primary inputs of the combinational circuit. The reason is that when the test pattern "110" is applied to the primary inputs of the combinational circuit, the primary output of the combinational circuit is "1" in the case that the stuck-at 0 fault is not present therein, and the primary output of the combinational circuit is "0" in the case that the stuck-at 0 fault is present therein, and hence it is possible to identify whether a fault is present in the combinational circuit or not, if the test pattern "110" is applied thereto. Further, when the value of the test pattern is carefully observed, it can be seen that the test pattern is generated such that it takes an opposite or complementary logical value "1" at the site of the stuck-at 0 fault.

Recently, an integrated circuit (IC) has been miniaturized more and more, and a delay time occurring when a signal propagates on a signal path or line in an IC tends to become larger than a gate delay time. As a result, a delay fault testing has begun to be used in a microprocessor test (for example, refer to a reference literature d3). Next, a conventional delay fault testing method will briefly be explained (for example, refer to a reference literature d4).

Delay faults are classified into a gate delay fault and a path delay fault. If a delay time occurring when a signal propagates through a gate exceeds the worst value, it is said that this gate has a gate delay fault present therein. Similarly, if a delay time occurring when a signal propagates on a signal path exceeds the worst value, it is said that the signal path has a path delay fault present therein.

The delay fault testing requires two kinds of test patterns. FIG. 9 shows an example of the delay fault testing. The illustrated circuit under test is a combinational circuit configured such that it comprises a first NAND gate ND1, a second NAND gate ND2 and a third NAND gate ND3, and the outputs of the first and second NAND gates ND1 and ND2 are inputted to the third NAND gate ND3. First, an initializing pattern $V_1$ is applied, using a slow clock, to primary inputs of the circuit under test. The initializing pattern $V_1$ in this example is "1111". In order to prevent a delay fault from affecting the state setting, a slow clock is used. After the circuit under test has entered by transition into an expected state, a test pattern $V_2$ is applied to the primary inputs of the circuit under test using a fast clock (high-speed clock). The test pattern $V_2$ in this example is "0101". As a result, in FIG. 9, the upper side signal line of the two input signal lines of each of the first and the second NAND gates ND1 and ND2 (the signal line to which "0" in the $V_2$ is inputted), and the signal lines from the outputs of the first and the second NAND gates ND1 and ND2 to the third NAND gate ND3 are activated, thereby pulses corresponding to the test pattern $V_2$ propagate on those signal lines. Consequently, a pulse appears at the primary output of the circuit under test (the output of the third NAND gate ND3) in correspondence to its propagation delay time or transmission delay time. The value of the outputted pulse is latched using the fast clock. The latched value is used to determine whether a delay fault is present or not. Usually, a system clock is used as the fast clock. FIG. 10 shows a concept of the delay fault testing described above. A plurality of input latches 31 and a plurality of output latches 32 are connected to the preceding stage and the subsequent stage of the circuit under test (combinational circuit) 30, respectively.

It is very difficult to generate test patterns for a delay fault testing. In order to detect the target delay fault independently of its delay time and all other delay faults located in the circuit, the following condition must be satisfied. That is, both "a pulse propagating on an activated signal line" and "a pulse propagating on a branched signal line which joins the activated signal line" must be free of glitch (for example, refer to a reference literature d5). For this reason, the conventional delay fault testing method could have detected only delay faults present in limited signal lines.

As VLSI circuits are developing more and more in their density and scale, it is more difficult to synchronize all of the edges of clocks generated within a chip with the edge of the reference clock and to distribute the clock with the minimum skew. For this reason, an algorithm called H-tree configuration, for example, is introduced in the layout design of a clock-distribution network (wiring for distributing the clock). This curve called H-tree is a Hilbert curve shown in FIG. 11 (for example, refer to a reference literature d6). Since, in the H-tree, a path length ranging from the clock driver to a cell connected to each of leaf nodes is constant, the clock skew theoretically becomes zero. In addition, the Hilbert curve is self-similar and is able to reconstruct a brain structure (three-dimensional wiring layout) (for example, refer to a reference literature d7). Further, the Hilbert curve is characterized in that it can recursively draw. An application of the Hilbert curve to the clock-distribution network of three-dimensional circuit or the like is an interesting field to study.

As the operation speed or rate of a VLSI circuit is increasing more and more, at-speed testing of clock-distribution networks has become more important. However, the conventional delay fault testing method is not suitable for efficiently testing clock-distribution networks.

As shown in FIG. 12, it is difficult from the following reasons to test delay faults in a PLL circuit 40 using the aforementioned conventional delay fault testing method. First, (i) when one or more latches are added in the PLL circuit 40, an additional skew is given to the internal clock of the PLL circuit 40. As a result, an overhead is produced in order to achieve a high-speed operation to be targeted. Next, (ii) in order to latch an internal clock of the PLL circuit, a faster clock is necessary. That is, this results in a self-contradiction.

SUMMARY OF THE INVENTION

It is an object of the present invention to provide an apparatus for and a method of detecting a delay fault in a phase-locked loop circuit utilizing the slope of an instantaneous phase of an analytic signal.

In order to accomplish the above object, in an aspect of the present invention, there is provided a method of detecting a delay fault in a phase-locked loop circuit which comprises the steps of: applying a frequency impulse to a phase-locked loop circuit to cause a state transition therein; estimating, from an output signal from the phase-locked loop circuit, an instantaneous phase of the output signal; and measuring, from the fluctuation term of the instantaneous phase, a time duration during which the phase-locked loop circuit remains in a state of oscillating a certain frequency.

In a preferred embodiment, the step of estimating an instantaneous phase includes the steps of: transforming a waveform of the output signal from the phase-locked loop circuit to an analytic signal; and estimating an instantaneous phase of the analytic signal, and the step of measuring a time duration includes the step of: detecting a delay fault by comparing a time duration during which the phase-locked loop circuit remains in a state of oscillating a certain frequency with a time duration during which a fault-free phase-locked loop circuit remains in a state of oscillating that certain frequency.

In an another aspect of the present invention, there is provided an apparatus for detecting a delay fault in a phase-locked loop circuit which comprises: means for applying a frequency impulse to a phase-locked loop circuit under test as the reference clock signal; means for transforming a waveform of the signal outputted from the phase-locked loop circuit under test to an analytic signal; means for estimating an instantaneous phase of the analytic signal; and means for measuring a delay time from the fluctuation term of the estimated instantaneous phase.

In a preferred embodiment, the means for transforming a waveform of the signal outputted from said phase-locked loop circuit under test to an analytic signal is a Hilbert transformation pair generator, and further, there is provided means for estimating a linear phase from the estimated instantaneous phase and removing the estimated linear phase from the estimated instantaneous phase to obtain a fluctuation term of the instantaneous phase.

In addition, the means for measuring a delay time from the fluctuation term of the estimated instantaneous phase detects a delay fault by comparing a time duration during which the phase-locked loop circuit remains in a state of oscillating a certain frequency with a time duration during which a fault-free phase-locked loop circuit remains in a state of oscillating that certain frequency.

The above and other objects, constructions and effects of the present invention would easily be made clear from the description of the preferred embodiments discussed below with reference to the accompanying drawings.

BRIEF DESCRIPTION OF THE DRAWINGS

FIG. 1 is a block diagram showing an example of the synchronous system for minimizing a clock skew using a PLL circuit;

FIG. 2 is a waveform diagram of clock pulses for explaining the operation of the system shown in FIG. 1;

FIG. 3 is a block diagram showing a PLL circuit having a delay fault present in a phase-frequency detector;

FIG. 4 is a waveform diagram of clock pulses for explaining the operation of the PLL circuit shown in FIG. 3;

FIG. 5 is a block diagram showing a PLL circuit having a delay fault present in a charge pump circuit;

FIG. 6 is a waveform diagram of clock pulses for explaining the operation of the PLL circuit shown in FIG. 5;

FIG. 7 is a diagram for explaining state transitions of the phase-frequency detector in the PLL circuit;

FIG. 8 is a circuit diagram showing an example of the combinational circuit in which a stuck-at fault is present;

FIG. 9 is a circuit diagram showing an example of the combinational circuit in which a delay fault is present;

FIG. 10 is a block diagram showing a concept of the delay fault testing method;

FIG. 11 is a diagram showing an example of Hilbert curve;

FIG. 12 is a block diagram showing a concept of the case in which a conventional delay fault testing method is applied to a PLL circuit;

FIGS. 13a–13b are diagrams showing an analog frequency-Down signal applied to a VCO in a PLL circuit and a corresponding change of a phase noise waveform $\Delta\phi(t)$;

FIGS. 14a–14b are diagrams showing an analog frequency-Up signal applied to a VCO in the PLL circuit and a corresponding change of a phase noise waveform $\Delta\phi(t)$;

FIGS. 15a–15b are waveforms diagram for explaining a method of detecting a delay fault from a phase noise waveform $\Delta\phi(t)$ of a fault-free PLL circuit and a phase noise waveform $\Delta\phi(t)$ of a PLL circuit having a fault present therein;

FIGs. 16a–16b are waveforms diagram showing an example of the frequency impulse which causes a PLL circuit to enter into a state transition;

FIG. 17 is a block diagram showing a first embodiment of the delay fault detecting apparatus according to the present invention;

FIG. 18 is a characteristic diagram showing parameters of a MOS.FET;

FIG. 19 is a block diagram showing a PLL circuit comprised of 0.6-$\mu$m CMOS.FETs;

FIG. 20(a) shows an input waveform to a VCO in the PLL circuit shown in FIG. 19;

FIG. 20(b) is a waveform diagram showing an internal clock of the PLL circuit;

FIG. 21(a) shows a waveform obtained from the result that an instantaneous period of an oscillation waveform of the VCO in the PLL circuit shown in FIG. 19 has been measured by using a zero-crossing method;

FIG. 21(b) is a diagram showing a phase noise waveform $\Delta\phi(t)$ estimated by the method of the present invention;

FIG. 22 is a block diagram showing an example of the PLL circuit having a delay fault present therein which cannot be tested by the method of the present invention;

FIG. 23(a) shows an input waveform to a VCO in the PLL circuit shown in FIG. 22;

FIG. 23(b) is a waveform diagram showing an internal clock of the PLL circuit;

FIG. 24(a) is a waveform diagram obtained from the result that an instantaneous period of an oscillation waveform of the VCO in the PLL circuit shown in FIG. 22 has been measured by a zero-crossing method;

FIG. 24(b) is a diagram showing a phase noise waveform $\Delta\phi(t)$ estimated by the method of the present invention;

FIG. 25 is a block diagram showing an example of the PLL circuit having a delay fault present therein which can be tested by the method of the present invention;

FIG. 26(a) shows an input waveform to a VCO in the PLL circuit shown in FIG. 25;

FIG. 26(b) is a waveform diagram showing an internal clock of the PLL circuit;

FIG. 27(a) is a waveform diagram obtained from the result that an instantaneous period of an oscillation waveform of the VCO in the PLL circuit shown in FIG. 25 has been measured by a zero-crossing method;

FIG. 27(b) is a diagram showing a phase noise waveform $\Delta\phi(t)$ estimated by the method of the present invention;

FIG. 28 is a block diagram showing an another example of the PLL circuit having a delay fault present therein which can be tested by the method of the present invention;

FIG. 29(a) shows an input waveform to a VCO in the PLL circuit shown in FIG. 28;

FIG. 29(b) is a waveform diagram showing an internal clock of the PLL circuit;

FIG. 30(a) is a waveform diagram obtained from the result that an instantaneous period of an oscillation waveform of the VCO in the PLL circuit shown in FIG. 28 has been measured by a zero-crossing method;

FIG. 30(b) is a diagram showing a phase noise waveform Δϕ(t) estimated by the method of the present invention;

FIG. 31 is a diagram showing an experimental result when the PLL circuit shown in FIG. 25 has been tested by the method of the present invention; and FIG. 32 is a diagram showing an experimental result when the PLL circuit shown in FIG. 28 has been tested by the method of the present invention.

DETAILED DESCRIPTION OF THE PREFERRED EMBODIMENTS

Now, the present invention will be described regarding its preferred embodiments in detail with reference to FIGS. 13 to 32. In this section, a principle of the proposed delay test will be described. The subject delay fault in this section does not include the delay fault present at the reference clock input end of the phase-frequency detector which has been made clear in the section 4.1.2.

First, the principle of the method of detecting a delay fault according to the present invention will be discussed. An output of a phase-frequency detector in a PLL circuit provides a VCO with a phase difference (differential of phase) from the reference clock at each time point. The VCO changes its oscillation frequency to track the frequency of the reference clock. Incidentally, an instantaneous frequency Δf is given by differentiating an instantaneous phase waveform θ(t) with respect to time.

$$\Delta f = \frac{1}{2\pi} \times \frac{d\theta(t)}{dt} \quad (4.1.1)$$

When Δf is constant, it is seen from the equation (4.1.1) that an instantaneous phase exhibits a constant slope to time.

$$\frac{d\theta(t)}{dt} 2\pi(\Delta f) \quad (4.2)$$

FIG. 13(a) shows an analog signal being applied to the VCO, and FIG. 13(b) shows a phase noise waveform Δϕ(t). For example, when the oscillation frequency of the VCO is changed from a high frequency $f_H$ to a low frequency $f_L$, the instantaneous phase exhibits, as indicated by an arrow in FIG. 13(b), a negative slope. When a Down signal of the analog signal shown in FIG. 13(a) is applied to the VCO, the corresponding change of the phase noise waveform Δϕ(t) becomes as shown in FIG. 13(b), assuming that the PLL circuit has a constant static frequency error $\Delta f_\epsilon$ (for example, refer to a reference literature d8). That is, the phase noise waveform Δϕ(t) rapidly changes with a negative slope in correspondence to the Down signal, and changes, after a state transition to a low frequency $f_L$, with an slope proportional to the static frequency error $\Delta f_\epsilon$. If the static frequency error $\Delta f_\epsilon$ is zero, the phase noise waveform Δϕ(t) goes in parallel with the time axis. On the contrary, when the oscillation frequency of the VCO is changed from a low frequency $f_L$ to a high frequency $f_H$, the instantaneous phase exhibits, as indicated by an arrow in FIG. 14(b), a positive slope. FIG. 14(a) shows an analog signal being applied to the VCO.

FIG. 15 is a waveform diagram for explaining the concept of a method of estimating a delay time from a phase noise waveform Δϕ(t) of a clock waveform $X_c(t)$ wherein FIG. 15(a) shows a phase noise waveform Δϕ(t) of a delay fault-free PLL circuit in which no delay fault is present, and FIG. 15(b) shows a phase noise waveform Δϕ(t) of a PLL circuit in which a delay fault is present at a point other than the reference clock input end of the phase-frequency detector. It is assumed that the instantaneous frequency of the voltage-controlled oscillator completes a state transition from a frequency $f_0$ to a frequency $f_1$ at a time point $t_1$. The slope of an instantaneous phase indicates a change expressed by the following equation (4.3.1).

$$\frac{d\theta(t)}{dt} = 2\pi(\Delta f_1), \quad t_1 < t < t_2 \quad (4.3.1)$$

In this case, $\Delta f_1$ is equal to $\Delta f_\epsilon$ or zero. Similarly, when the instantaneous frequency of the voltage-controlled oscillator completes the state transition from $f_1$ to $f_2$ at a time point $t_2$, the slope of the instantaneous phase is expressed by the next equation (4.3.2).

$$\frac{d\theta(t)}{dt} = 2\pi(\Delta f_2), \quad t_2 < t < t_3 \quad (4.3.2)$$

This means that if the slope of the instantaneous phase waveform is observed, the internal state of the voltage-controlled oscillator can be monitored. Note that the state can be monitored even if $\Delta f_\epsilon$ is zero. In addition, if a time point when the slope is changed is found, a starting time or an ending time of the state transition can be measured. Since a delay fault delays the starting time of state transition, a delay fault of the PLL circuit can be tested if a time interval ($t_2-t_1$) during which it remains in a certain state can be measured. Note that a delay fault present at the reference clock input end of the phase-frequency detector is excluded from the testable faults.

Next, a discussion will be made on a signal to be applied to the PLL circuit upon testing a delay fault. As mentioned above, an influence of a delay fault can be observed by being accompanied with a state transition. Even if a sine wave is applied to the PLL circuit, no state transition occur therein. Therefore, a stationary signal cannot be utilized in the testing for delay faults. On the other hand, when a frequency impulse shown in FIG. 16(b) is applied to the PLL circuit, the phase-frequency detector outputs an error signal corresponding to the frequency change, and state transitions occur in the PLL circuit. That is, a transient signal should be used as a signal to be applied in the testing for delay faults.

FIG. 16(a) is a waveform diagram showing a change of the reference clock pulse. When a frequency impulse is applied, the reference clock pulse changes its frequency in impulse manner only in one period thereof, during the time interval that the frequency impulse is being applied. As a result, the PLL circuit undergoes state transitions twice. When a frequency impulse shown in FIG. 16(b) is applied to the PLL circuit, the phase-frequency detector outputs a frequency Up signal at the rising edge of the impulse, and then outputs a frequency Down signal at the falling edge of the impulse. Therefore, if a frequency impulse is used, the time duration ($t_2-t_1$) required by the equation (4.3.1) can be given uniquely.

The delay fault detecting method and apparatus according to the present invention are invented by paying attention to the slope of an instantaneous phase, and are the expansions or developments of a method of and an apparatus for estimating a jitter using a clock waveform of a fundamental frequency, respectively.

FIG. 17 is a block diagram showing an example of the delay fault detecting apparatus according to the present invention. This delay fault detecting apparatus comprises a frequency impulse generator 51 for generating a frequency impulse signal, a PLL circuit under test 52 being tested as to whether or not a delay fault is present therein, a Hilbert transformation pair generator 53 to which an output from the PLL circuit under test is supplied, an instantaneous phase estimator 54 to which a pair of output signals from the Hilbert transformation pair generator 53 are supplied, a linear phase remover 55 to which an output signal from the instantaneous phase estimator 54 is supplied, and a delay fault finder 56 for determining whether a delay fault is present or not, from the output signal from the linear phase remover 55.

The Hilbert transformation pair generator 53 transforms a clock waveform $X_c(t)$ to an analytic signal $Z_c(t)$. For example, when a cosine wave is Hilbert-transformed, the following equation is obtained.

$$H[\cos (2 \pi f_0 t)] = \sin (2 \pi f_0 t)$$

From this equation, a Hilbert transformation of the clock waveform $X_c(t)$ is obtained as follows:

$$\hat{x}_c(t) = H[X_c(t)] = A_c \sin (2\pi f_c t + \theta_c + \Delta\phi(t))$$

Assuming that $X_c(t)$ and $\hat{X}_c(t)$ are a real part and an imaginary part of a complex number, respectively, an analytic signal expressed by the following equation is obtained.

$$z_c(t) = x_c(t) + j\hat{x}_c(t) = A_c \cos (2\pi f_c t + \theta_c + \Delta\phi(t)) + jA_c \sin (2\pi f_c t + \theta_c + \Delta\phi(t))$$

Since a Fourier series of an ideal clock waveform is given by the following equation, $$x_{d50\%}(t) = \frac{1}{2} + \frac{2}{\pi}\left[\cos\frac{2\pi}{T_0}t - \frac{1}{3}\cos 3\frac{2\pi}{T_0}t + \frac{1}{5}\cos 5\frac{2\pi}{T_0}t - ...\right]$$

a Hilbert transformation of a square wave corresponding to the clock waveform is given by the following equation using $H[\cos(2 \pi f_0 t)] = \sin(2 \pi f_0 t)$.

$$H[x_{d50\%}(t)] = \frac{2}{\pi}\left[\sin\frac{2\pi}{T_0}t - \frac{1}{3}\sin 3\frac{2\pi}{T_0}t + \frac{1}{5}\sin 5\frac{2\pi}{T_0}t - ...\right]$$

An analytic signal z(t) was introduced by J. Dugundji to uniquely obtain an envelope of a waveform. If an analytic signal is expressed in a polar coordinate form, the following equations are obtained.

$$z(t) = A(t)e^{j\Theta(t)}$$

$$A(t) = \sqrt{x_a^2(t) + \hat{x}_a^2(t)}$$

$$\Theta(t) = \tan^{-1}\left[\frac{\hat{x}_a(t)}{x_a(t)}\right]$$

A(t) represents an envelope of $X_a(t)$. For this reason, J. Dugundji calls z(t) a pre-envelope. $\Theta(t)$ represents an instantaneous phase of $X_a(t)$.

A frequency impulse is applied to the PLL circuit under test 52 as a reference clock signal from the frequency impulse generator 51. Since the frequency of the reference clock signal changes, the PLL circuit under test 52 undergoes state transitions, and hence the influence of the state transitions appears in the clock waveform at the output of the PLL circuit in the case that a delay fault is present therein. The Hilbert transformation pair generator 53 transforms an acquired clock waveform $X_c(t)$ to an analytic signal $z_c(t)$, and the instantaneous phase estimator 54 estimates the instantaneous phase of the analytic signal to measure a delay time from a fluctuation term $\Delta\phi(t)$ of the instantaneous phase.

Summarizing the signal processing procedure, by estimating an instantaneous phase of a clock signal $X_c(t)$, the following equation (4.4.1) is obtained.

$$\Theta(t) = [2 \pi f_c t + \theta_c + \Delta\phi(t)] \mod 2\pi \quad (4.4.1)$$

By applying a phase unwrap method to the $\Theta(t)$, the following equation (4.4.2) is obtained.

$$\theta(t) = 2 \pi f_c t + \theta_c + \Delta\phi(t) \quad (4.4.2)$$

Further, a linear phase $[2 \pi f_c t + \theta_c]$ is estimated from $\theta(t)$ using a linear trend estimating method or linear function fitting method. However, the range for estimating a linear phase is limited to up to a time point $t_{impulse}$ at which a frequency impulse shown in FIG. 16(b) is applied. Next, when a linear phase is removed from $\theta(t)$, the fluctuation term $\Delta\phi(t)$ is given by the next equation (4.4.3).

$$\theta(t) = \Delta\phi(t) \quad (4.4.3)$$

Finally, a time interval $(t_2 - t_1)$ during which the PLL circuit remains in a certain state is estimated, using the equation (4.3.1), from the phase slope at a time point after the time point timpulse. By comparing this time interval $(t_2 - t_1)$ with a time interval $(t_{2,Fault-Free} - t_{2Fault-Free})$ of a delay fault-free PLL circuit in which no delay fault is present, it is determined whether a delay fault is present or not.

In the present invention, this delay fault testing method is also referred to as a $\Delta\phi(t)$ method. This $\Delta\phi(t)$ method can test any delay fault present in the analog components (the charge pump circuit, the loop filter, or the VCO) of the PLL circuit 52 at one time.

Next, a specific example 1 in which the present invention is applied to a delay fault-free PLL circuit will be explained. FIG. 19 is a block diagram showing the delay fault-free PLL circuit in which no delay fault is present. This PLL circuit comprises, as is usual, a phase-frequency detector 21, a charge pump circuit 22, a loop filter 23, a VCO 24 and a clock decode and buffer circuit 25.

The illustrated PLL circuit is comprised of 0.6-$\mu$m CMOS FETs and the power supply voltage is set to 5 V. Various waveforms were obtained through a SPICE simulation. FIG. 18 shows parameters of the CMOS-FET. The oscillation frequency of the VCO 24 is 128 MHz. The time resolution of the simulation waveform is 50 psec. A phase noise waveform $\Delta\phi(t)$ was measured from the waveform of the simulation result. The measurement of this $\Delta\phi(t)$ was simulated using Matlab.

FIG. 20(a) shows an input waveform to the VCO 24. In this specific example, a frequency impulse is applied to the reference clock input end of the PLL circuit at the time point 1000.5 nsec. The frequency of the frequency impulse is changed, as shown in FIG. 19, from a high frequency to a low frequency, and from a low frequency to a high frequency. FIG. 20(b) shows an internal clock waveform of the PLL circuit. It is seen that a frequency Down pulse is inputted to the VCO 24 at the next rising edge (time point of approximately 1032 nsec.) after the application of the frequency impulse. A frequency Up pulse is applied to the VCO 24 at the time point of approximately 1098 nsec.

FIG. 21 shows waveform diagrams for comparing the conventional zero-crossing method with the method according to the present invention. FIG. 21(*a*) is a measurement result of an instantaneous period of the oscillation waveform of the VCO 24 measured by the zero-crossing method. The dotted line indicates an instantaneous period of the reference clock waveform. FIG. 21(*b*) shows a $\Delta\phi(t)$ estimated using the following algorithm (procedure for transforming a real waveform to an analytic signal of its fundamental frequency) used in the method of the present invention.

1. $X_c(t)$ is transformed into frequency domain using the fast Fourier transform.
2. Negative frequency components are cut to zero. Only frequency components in the neighbor of the clock frequency are extracted by a bandpass filter and other positive frequency components are cut to zero.
3. A spectrum is transformed to time domain using inverse fast Fourier transform. The spectrum in the frequency range (20 MHz–200 MHz) in which the second harmonic is not included is extracted by a bandpass filter and a $\Delta\phi(t)$ is obtained by the inverse fast Fourier transform.

It is seen, from FIG. 21(*a*), that the frequency impulse has returned to the original period at the time point of approximately 1066 nsec. After approximately 57.70 nsec from the time point, the VCO 24 is trying to decrease the period in response to the rising edge of the frequency impulse. When the $\Delta\phi(t)$ of FIG. 21(*b*) is observed, it is seen that a state transition due to the frequency Down pulse has completed at the time point $t_1$ of approximately 1050 nsec, and another state transition corresponding to the next frequency Up pulse begins at the time point $t_2$ after approximately 58.30 nsec from the time point $t_1$. This specific example 1 verifies that a time duration during which the PLL circuit remains in a certain state can be estimated if a measurement of the slope of an instantaneous phase and an frequency impulse are combined.

Next, a specific example 2 in which the present invention is applied to a PLL circuit having a delay fault at the reference clock input end will be explained. FIG. 22 is a block diagram showing a PLL circuit having a delay fault DF1 present at a reference clock input end of the phase-frequency detector 21. The configuration of this PLL circuit is same as that shown in FIG. 19. This type of delay fault cannot be tested by the method of the present invention. The reason for this will be made clear in the following.

The PLL circuit shown in FIG. 22 was simulated by SPICE. The delay fault DF1 present at the reference input end was materialized by adding thereto the even number of high-speed inverters.

FIG. 23(*a*) shows an input waveform to the VCO 24. The frequency of the frequency impulse is changed, as shown in FIG. 22, from a high frequency to a low frequency, and from a low frequency to a high frequency. FIG. 23(*b*) shows an internal clock waveform of the PLL circuit. The dotted line indicates the reference clock waveform. It is seen that the internal clock waveform of the PLL circuit does not accord with the reference clock waveform, and that a constant clock skew occurs.

FIG. 24 shows waveforms for comparing the conventional zero-crossing method with the method according to the present invention. FIG. 24(*a*) is a measurement result of an instantaneous period of the oscillation waveform of the VCO 24 measured by the zero-crossing method. The dotted line indicates an instantaneous period of the reference clock waveform. FIG. 24(*b*) shows a $\Delta\phi(t)$ estimated using the aforementioned algorithm (procedure for transforming a real waveform to an analytic signal of its fundamental wave) used in the method of the present invention.

It is seen from FIG. 24 that even if a delay fault DF1 is present at the reference clock input end, the PLL circuit has correctly undergone state transitions. Therefore, this type of delay faults cannot be detected by only monitoring the internal state. On the contrary, as can be understood from FIG. 23(*b*), this delay fault can easily be detected by comparing with an external reference clock. This specific example 2 verifies that the method of the present invention cannot detect the delay fault DF1 present at the reference clock input end.

Next, a specific example 3 in which the present invention is applied to a PLL circuit having a delay fault at the signal input end of the charge pump circuit will be explained. FIG. 25 is a block diagram showing a PLL circuit having a delay fault DF2 present at a signal input end of the charge pump circuit 22. The configuration of this PLL circuit is the same as that shown in FIG. 19.

The charge pump circuit 22 has two signal input ends. That is, a logical signal Up or Down inputted from the phase-frequency detector 21 is converted to an analog signal by the charge pump circuit 22. The logical signals Up and Down correspond to state transitions of "increasing the frequency" and "decreasing the frequency", respectively. In order to activate the various state transitions, different frequency impulses are required. (i) For detecting a delay fault DF2 present at the input end of the logical signal Up, the frequency of the frequency impulse is sequentially changed from a high frequency to a low frequency, and from a low frequency to a high frequency. On the contrary, (ii) for detecting a delay fault DF3 (refer to FIG. 28) present at the input end of the logical signal Down, the frequency of the frequency impulse is sequentially changed from a low frequency to a high frequency, and from a high frequency to a low frequency. In this case, the same way of thinking as in the aforementioned stuck-at fault testing is applied. That is, for detecting a stuck-at 0 fault, it is sufficient that a test pattern which takes an opposite logical value "1" at the fault position is generated.

First, a PLL circuit having a delay fault DF2 present at the Up signal input end of the charge pump circuit 22 will be discussed. The PLL circuit shown in FIG. 25 was simulated by SPICE. The delay fault DF present at the Up signal input end is materialized by adding the even number of fast inverters to the input end. The delay time of the delay fault DF2 is 2.957 nsec. The frequency of the frequency impulse is changed, as shown in FIG. 25, from a high frequency to a low frequency, and from a low frequency to a high frequency.

FIG. 26(*a*) shows an input waveform to the VCO 24. FIG. 26(*b*) shows an internal clock waveform of the PLL circuit. The dotted line indicates a reference clock waveform.

FIG. 27 shows waveform diagrams for comparing the conventional zero-crossing method with the method according to the present invention. FIG. 27(*a*) is a measurement result of an instantaneous period of the oscillation waveform of the VCO 24 measured by the zero-crossing method. The dotted line indicates an instantaneous period of the reference clock waveform. The time duration $(t_2-t_1)$ during which the PLL circuit remains in a certain state is estimated to be approximately 61.65 nsec. FIG. 27(*b*) shows a $\Delta\phi(t)$ estimated using the aforementioned algorithm (procedure for transforming a real waveform to an analytic signal of its fundamental frequency) used in the method of the present invention. The time duration $(t_2-t_1)$ is estimated to be approximately 61.90 nsec.

Next, a PLL circuit having a delay fault DF3 present at the Down signal input end of the charge pump circuit will be discussed. The PLL circuit shown in FIG. 29 was simulated by SPICE. The delay fault DF3 present at the Down signal input end is materialized by adding the even number of fast inverters to the input end. The delay time of the delay fault is 4.413 nsec. The frequency of the frequency impulse is changed, as shown in FIG. 28, from a low frequency to a high frequency, and from a high frequency to a low frequency.

FIG. 29(a) shows an input waveform to the VCO 24. FIG. 29(b) shows an internal clock waveform of the PLL circuit. The dotted line indicates a reference clock waveform.

FIG. 30 shows waveform diagrams for comparing the conventional zero-crossing method with the method according to the present invention. FIG. 30(a) is a measurement result of an instantaneous period of the oscillation waveform of the VCO 24 measured by the zero-crossing method. The dotted line indicates an instantaneous period of the reference clock waveform. The time duration $(t_2-t_1)$ is estimated to be approximately 29.25 nsec. FIG. 30(b) shows a $\Delta\phi(t)$ estimated using the aforementioned algorithm (procedure for transforming a real waveform to an analytic signal of its fundamental wave) used in the method of the present invention. The time duration $(t_2-t_1)$ is estimated to be approximately 25.20 nsec.

Next, the method according to the present invention (the $\Delta\phi(t)$ method) will be compared with the conventional zero-crossing method. The PLL circuit shown in FIG. 25 was used in the experiment and the delay time of the fault present at the signal input end of the charge pump circuit 22 was changed from 0 nsec. through 7 nsec.

FIG. 31 shows a result of the experiment on the PLL circuit having a delay fault DF2 present at the Up signal input end of the charge pump circuit 22. It is seen that the method according to the present invention (the $\Delta\phi(t)$ method) provides an estimated value substantially compatible with the zero-crossing method. The estimated delay time shows stepped changes. This is because the phase-frequency detector 21 starts state transitions of the PLL circuit only at discrete timings of clock edges.

FIG. 32 shows a result of the experiment on the PLL circuit having a delay fault DF3 present at the Down signal input end of the charge pump circuit 22. Comparing the conventional zero-crossing method with the method according to the present invention, it is seen that the zero-crossing method has a large bias error. This is because the measurement point of the zero-crossing method is limited only to the zero-crossing. On the other hand, the method according to the present invention (the $\Delta\phi(t)$ method) has no restriction on the time resolution even if the period of the waveform is short. Because, when FIGS. 31 and 32 are observed, the method of the present invention has apparently detected a delay fault equal to or longer than 2 nsec. That is, the method according to the present invention can detect a delay fault independently of the period of the waveform.

As is apparent from the above results, the method according to the present invention (the $\Delta\phi(t)$ method) causes the PLL circuit to undergo state transitions so that the oscillation frequency thereof is lowered, and provides an estimated value compatible with the zero-crossing method in the case of estimating the time duration during which the PLL circuit remains in a certain state. In the case of causing the PLL circuit to undergo state transitions so that the oscillation frequency thereof becomes higher, and the time duration during which the PLL circuit remains in a certain state is estimated, the method according to the present invention provides a smaller bias error than that of the zero-crossing method.

However, the method according to the present invention (the $\Delta\phi(t)$ method) cannot measure a delay time caused by a delay fault. This is clear from the fact that each of the time durations plotted in FIGS. 31 and 32 does not change proportionally to a delay time of a delay fault.

As mentioned above, the present invention takes the steps of: (i) a frequency impulse is applied to a PLL circuit; (ii) the PLL circuit is temporarily held in a state of oscillation of a certain frequency; and (iii) a delay fault in the PLL circuit is detected by measuring the time duration of that oscillation state. Therefore, the method of detecting a delay fault according to the present invention is characterized in that (i) no trigger signal is required for a sampling operation; and (ii) the time resolution is not restricted even if the period of the waveform is short.

On the other hand, the zero-crossing method requires (i) a trigger signal for sampling; and has (ii) a large bias error when the period of the waveform is short. These facts have been verified, as mentioned above, through a SPICE simulation and a measurement simulation using Matlab.

In addition, since a PLL circuit is a feedback system, a delay fault generates a transient skew. That is, since a timing at which a skew occurs is limited, it is difficult to implement a test using a trigger as in the zero-crossing method. Because the target zero-crossings must precisely be captured. On the contrary, the method of measuring a delay fault according to the present invention has an advantage that the time resolution is not restricted. Further, there is an advantage that delay faults present in the mixed-signal blocks (the charge pump circuit, the loop filter and the VCO) can be tested at one time.

While the present invention has been described with regard to the preferred embodiments shown by way of example, it will be apparent to those skilled in the art that various modifications, alterations, changes, and/or minor improvements of the illustrated embodiments can be made without departing from the spirit and the scope of the present invention. Accordingly, it should be understood that the present invention is not limited to the embodiments shown and described above, and is intended to encompass all of such various modifications, alterations, changes, and/or minor improvements falling within the scope of the invention defined by the appended claims.

Further, the aforementioned reference literatures d1–d8 are as follows.

[d1] Jan M. Rabaey, Digital Integrated Circuits: A Design Perspective, Prentice-Hall, Inc., 1996.

[d2] Hideo Fujiwara, Design And Test Of A Computer, Kogakutosho Co., Ltd., 1990.

[d3] R. Scott Fetherston, Imtiaz P. Shaik and Siyad C. Ma, "Testability Features of AMD-K6 Microprocessor", IEEE International Test Conference, pp. 406–413, 1997.

[d4] Sudhakar M. Reddy, Delay Fault: Modeling, Fault Simulation, and Test Generation, IEEE International Test Conference Tutorial, 1995.

[d5] Ankan K. Ppramanick and Sudhakar M. Reddy, "On the Design of Path Delay Fault Testable Combinational Circuits", IEEE International Fault-Tolerant Computing Symposium, pp. 374–381, 1990.

[d6] Niklaus Wirth, Algorithm+Data Structure=Program, Kagakugijutsu Shuppansha, 1979.

[d7] Manfred Schroeder, Fractals, Chaos, Power Laws, W. H. Freeman and Company, 1991.

[d8] Floyd M. Gardner, "Phase Accuracy of Charge Pump PLL's", IEEE Trans. Commun., vol. COM-30, pp. 2362–2363, 1982.

What is claimed is:

1. A method of detecting a delay fault in a phase-locked loop circuit comprising the steps of:

applying a frequency impulse to a phase-locked loop circuit to cause a state transition therein:

estimating, from an output signal from said phase-locked loop circuit, an instantaneous phase of said output signal; and measuring, from the fluctuation term of said instantaneous phase, a time duration during which said phase-locked loop circuit remains in a state of oscillating a certain frequency.

2. The method according to claim 1, wherein said step of estimating an instantaneous phase includes the steps of:

transforming a waveform of the output signal from said phase-locked loop circuit to an analytic signal; and estimating an instantaneous phase of said analytic signal; and wherein said step of measuring a time duration includes the step of:

detecting a delay fault by comparing a time duration during which said phase-locked loop circuit remains in a state of oscillating a certain frequency with a time duration during which a fault-free phase-locked loop circuit remains in a state of oscillating that certain frequency.

3. An apparatus for detecting a delay fault in a phase-locked loop circuit comprising:

means for applying a frequency impulse to a phase-locked loop circuit under test as the reference clock signal;

means for transforming a waveform of the signal outputted from said phase-locked loop circuit under test to an analytic signal;

means for estimating an instantaneous phase of said analytic signal; and means for measuring a delay time from the fluctuation term of the estimated instantaneous phase.

4. The apparatus according to claim 3, wherein said means for transforming a waveform of the signal outputted from said phase-locked loop circuit under test to an analytic signal is a Hilbert transformation pair generator, and further, there is provided means for estimating a linear phase from the estimated instantaneous phase and removing the estimated linear phase from the estimated instantaneous phase to obtain a fluctuation term of the instantaneous phase.

5. The apparatus according to claim 3, wherein said means for measuring a delay time from the fluctuation term of the estimated instantaneous phase detects a delay fault by comparing a time duration during which said phase-locked loop circuit remains in a state of oscillating a certain frequency with a time duration during which a fault-free phase-locked loop circuit remains in a state of oscillating that certain frequency.

* * * * *